(12) United States Patent
Notte, IV

(10) Patent No.: US 6,891,167 B2
(45) Date of Patent: May 10, 2005

(54) APPARATUS AND METHOD FOR APPLYING FEEDBACK CONTROL TO A MAGNETIC LENS

(75) Inventor: John A. Notte, IV, Windham, NH (US)

(73) Assignee: KLA-Tencor Technologies, Milpitas, CA (US)

( * ) Notice: Subject to any disclaimer, the term of this patent is extended or adjusted under 35 U.S.C. 154(b) by 420 days.

(21) Appl. No.: 09/882,818

(22) Filed: Jun. 15, 2001

(65) Prior Publication Data

US 2003/0205678 A1 Nov. 6, 2003

Related U.S. Application Data

(60) Provisional application No. 60/212,104, filed on Jun. 15, 2000.

(51) Int. Cl.$^7$ .......................... H01J 37/252; H01J 37/28
(52) U.S. Cl. ........................... 250/396 ML; 250/396 R; 250/397
(58) Field of Search ..................... 250/396 ML, 396 R, 250/397, 398, 310, 309; 315/8

(56) References Cited

U.S. PATENT DOCUMENTS

| | | | |
|---|---|---|---|
| 3,922,546 A | | 11/1975 | Livesay |
| 4,084,095 A | * | 4/1978 | Wolfe ....................... 250/492.2 |
| 4,417,145 A | | 11/1983 | Norioka |
| 4,423,305 A | | 12/1983 | Pfeiffer |
| 4,806,766 A | | 2/1989 | Chisholm |
| 4,912,405 A | | 3/1990 | Richardson |
| 4,928,010 A | | 5/1990 | Saito et al. |
| 4,999,496 A | | 3/1991 | Shaw et al. |
| 5,039,911 A | | 8/1991 | Buhler |
| 5,057,689 A | * | 10/1991 | Nomura et al. .............. 250/310 |
| 5,089,428 A | | 2/1992 | Verret et al. |
| 5,117,155 A | * | 5/1992 | Buhler ............................ 315/8 |
| 5,172,364 A | * | 12/1992 | Yoshimoto et al. ......... 369/100 |
| 5,194,808 A | * | 3/1993 | Shintaku et al. ............. 324/248 |
| 5,241,176 A | | 8/1993 | Yonezawa |
| 5,502,306 A | | 3/1996 | Meisburger et al. |
| 5,506,482 A | * | 4/1996 | Teramatsu et al. ........... 315/382 |
| 5,563,415 A | | 10/1996 | Crewe |
| 5,578,821 A | | 11/1996 | Meisberger et al. |
| 5,629,526 A | * | 5/1997 | Nakasuji ............... 250/396 ML |
| 5,665,968 A | | 9/1997 | Meisburger et al. |
| 5,717,204 A | | 2/1998 | Meisburger et al. |
| 5,731,586 A | | 3/1998 | Takashima |
| 5,798,617 A | | 8/1998 | Moisin |
| 5,869,833 A | | 2/1999 | Richardson et al. |
| 5,872,358 A | | 2/1999 | Todokoro et al. |
| 5,900,629 A | | 5/1999 | Todokoro et al. |
| 5,952,667 A | | 9/1999 | Shimizu |

(Continued)

OTHER PUBLICATIONS

International Search Report, application No. PCT/US01/19437, mailed Oct. 11, 2001.

*Primary Examiner*—Nikita Wells
*Assistant Examiner*—Anthony Quash
(74) *Attorney, Agent, or Firm*—Ann Marie Mewherter; Daffer McDaniel, L.L.P.

(57) ABSTRACT

An apparatus configured to control a magnetic field strength of a magnetic lens is provided. The apparatus may include a magnetic sensor configured to generate an output signal responsive to a first magnetic field strength of the magnetic lens. The apparatus may also include a control circuit coupled to the magnetic sensor and the magnetic sensor. The control circuit may be configured to receive the output signal from the magnetic lens and to receive an input signal responsive to a predetermined magnetic field strength. The control circuit may be further configured to generate a control signal responsive to the output signal and the input signal. Additionally, the control circuit may be configured to apply a current to the magnetic lens such that a second magnetic field strength may be generated within the magnetic lens closer to the predetermined magnetic field strength than the first magnetic strength.

20 Claims, 9 Drawing Sheets

U.S. PATENT DOCUMENTS

| | | |
|---|---|---|
| 5,973,323 A | 10/1999 | Adler et al. |
| 6,002,135 A | 12/1999 | Veneklasen et al. |
| 6,107,633 A | 8/2000 | Frosien et al. |
| 6,188,071 B1 * | 2/2001 | Gordon et al. .............. 250/397 |
| 6,452,172 B1 * | 9/2002 | Oi .............................. 250/309 |
| 6,486,471 B1 * | 11/2002 | Oi .............................. 250/310 |

* cited by examiner

APPARATUS AND METHOD FOR APPLYING FEEDBACK CONTROL TO A MAGNETIC LENS

This application claims benefit of U.S. Provisional 60/212,104 filed Jun. 15, 2000.

BACKGROUND OF THE INVENTION

1. Field of the Invention

This invention generally relates to a magnetic lens which may be configured to apply a magnetic field to a charged particle beam, and more particularly, to a sectored magnetic lens and a control apparatus for a magnetic lens which may be incorporated into a scanning electron microscope system.

2. Description of the Related Art

As the dimensions of semiconductor devices continue to shrink with advances in semiconductor materials and processes, the ability to examine microscopic features and to detect microscopic defects has become increasingly important in the successful fabrication of advanced semiconductor devices. Significant research continues to focus on increasing the resolution limit of metrology tools that are used to examine microscopic features and defects. Optical microscopes generally have an inherent resolution limit of approximately 200 nm and have limited usefulness in current manufacturing processes. Microscopes that utilize electron beams to examine devices, however, may be used to investigate feature sizes as small as, e.g., a few nanometers. Therefore, tools that utilize electron beams to inspect semiconductor devices are increasingly becoming integral to semiconductor fabrication processes. For example, in recent years, scanning electron microscopy has become increasingly popular for the inspection of semiconductor devices. Scanning electron microscopy generally involves scanning an electron beam over a specimen and creating an image of the specimen by detecting electrons that are reflected, scattered, and/or transmitted by the specimen.

The electron optical system of a scanning electron microscope generally includes an electron source, a device or a plurality of devices configured to focus an electron beam generated by an electron source, a detector or a plurality of detectors configured to detect electrons reflected, scattered, or transmitted by the specimen, and a control system. A thermal field emission source may typically be used as an electron source, and the energy of the electron source may be controlled by an emission control electrode and an anode. The electron beam may pass through a magnetic condenser lens configured to collimate the electron beam. An initial deflection system may also be located near the electron source. An initial deflection system may be configured to correct alignment, stigmation and blanking of the beam. Prior to passing through a magnetic objective lens, the beam may also be passed through a beam limiting aperture and one or more electrostatic pre-lens deflectors. The magnetic objective lens may further focus the electron beam to a spot size of, for example, approximately five nanometers. As used herein, the term "spot size" is generally defined as a lateral dimension of an electron beam incident upon a specimen. A magnetic objective lens may typically include a lower pole piece, an intermediate electrode, and an upper pole piece.

An electron beam exiting a magnetic objective lens may be scanned across a specimen. Typically, the electron beam may be scanned in a first direction while the stage supporting the specimen may be moved in a direction perpendicular to the first direction. A plurality of detection systems may be used to detect secondary electrons, back-scattered electrons, and transmitted electrons that may be produced when the electrons contact the specimen. Examples of scanning electron microscope systems are illustrated, for example, in U.S. Pat. No. 4,928,010 to Saito et al., U.S. Pat. No. 5,241,176 to Yonezawa, U.S. Pat. No. 5,502,306 to Meisburger et al., U.S. Pat. No. 5,578,821 to Meisburger et al., U.S. Pat. No. 5,665,968 Meisburger et al., U.S. Pat. No. 5,717,204 to Meisburger et al., U.S. Pat. No. 5,869,833 to Richardson et al., U.S. Pat. No. 5,872,358 to Todokora et al., and U.S. Pat. No. 5,973,323 to Adler et al., and are incorporated by reference as if fully set forth herein.

The performance of a scanning electron microscope may vary depending on, for example, the capability to focus an electron beam on a small target area. High voltage electrons may penetrate deep into a semiconductor substrate or a portion of a semiconductor formed upon a semiconductor substrate thereby damaging the substrate or the device and rendering it unsuitable as a working device such as an integrated circuit. Therefore, low voltage electron beams may typically used to analyze delicate semiconductor specimens that otherwise might be damaged by high voltage electron sources. The primary factor that reduces resolution in the low acceleration voltage region is blur of the electron beam due to chromatic aberration. Dispersion in the energy of the electron beam emitted from the electron source typically causes chromatic aberration. As such, significant effort has been focused on improving the performance of a scanning electron microscope by enhancing the ability of the magnetic objective lens to reduce chromatic aberrations in an electron beam source especially in low voltage particle beams.

Traditionally, magnetic lenses may be axially symmetric and may produce axially symmetric magnetic potentials and magnetic fields. An example of such a magnetic lens is illustrated, for example, in U.S. Pat. No. 6,002,135 to Veneklasen et al. and is incorporated by reference as if fully set forth herein. A magnetic lens may include an inner pole piece that may have a cylindrical upper portion and a conical lower portion that may be substantially enclosed by an outer pole piece. The outer pole piece may also have a cylindrical upper portion and a conical lower portion corresponding to the inner pole pieces. A solenoidal excitation coil may be disposed between the inner pole piece and the outer pole piece. When a current is applied to the excitation coil, an axial focusing field may be generated within the lens by magnetic flux from the inner and outer pole pieces. The axial focusing field may be used to focus an electron beam. Shielding rings may be arranged between the upper and lower portions of the inner pole piece to reduce the air gap between the pole portions. The shielding rings may also provide a return path for deflection flux that may otherwise radiate through the gap and induce eddy currents in outer pole pieces and excitation coil. Deflection coils may also be included within the lens along the beam path.

Variable axis lenses have also been developed to focus electron beams. Variable axis lenses incorporate supplementary lenses or supplementary deflectors in the magnetic lens to provide some correction of electron beam paths that may be laterally displaced from an optical axis of the lens. The supplementary lenses and deflectors may be energized based on the lateral displacement of the beam path. Although electron beams may be deflected by this lens, astigmation may still be a problem. Therefore, a separate astigmation compensator may also be included in such a lens. Alternatively, an astigmatism-correction deflector system may be arranged within a variable axis lens adjacent the internal surface of the supplementary deflectors. Such deflectors may be constructed of an octapole three-stage coil in which each octapole includes two tetrapole sets. A deflection field coil may be added to one of the tetrapole coil sets of the octapole. An example of a variable axis lens is illustrated in U.S. Pat. No. 5,952,667 to Shimizu and is incorporated by reference as if fully set forth herein. The incorporation of a separate astigmator octapole forces the beam to pass through the center of this octapole. The overall alignment of the lens system, however, may be non-colinear due to the incorporation of such a separate feature. Therefore, complexity of the overall alignment of the system increases when the charged particle beam is forced to pass through successive non-colinear points.

There are, however, several disadvantages to the lens systems described above. For example, axially symmetric lenses may typically suffer from hysteresis, large inductance of the excitation coil, and thermal stability problems. Hysteresis may cause a relationship between the excitation coil current and the deflected beam position to depend upon past deflection history. Therefore, accurate focus of an electron beam using the magnetic lens may be extremely difficult to maintain and control. Additionally, large inductance of the excitation coil may cause thermal stability problems due to heat generated by the lens or the excitation coils. Therefore, the center of the lens may shift due to thermal expansion of the materials used to construct the lens.

Immersion lenses are also limited in their application to a variety of specimens. Immersion lenses are generally designed to limit aberrations of an electron beam by reducing the distance between the specimen and the maximum magnetic field. The distance between the specimen and the maximum magnetic field may be reduced by placing the specimen near or within the lens. Examples of immersion lenses are illustrated in U.S. Pat. No. 5,089,428 to Da Lin et al. and is incorporated by reference as if fully set forth herein. Due to space limitations, immersion lenses may not be able to accommodate a large specimen such as a semiconductor substrate. For example, 200 mm wafers, or semiconductor substrates, are already being used in the development and production of semiconductor devices. Efforts are also underway to further increase the size of semiconductor substrates to 300 mm. Modifying these lenses in order to accommodate such large semiconductor substrates may also adversely affect the performance of immersion lenses. Alternatively, reducing the size of the semiconductor substrate by cross-sectioning the wafer is not usually an option due to the cost associated with destroying a product wafer.

An asymmetric immersion lens may be configured to reduce the distance between a specimen and the strongest magnetic field of the lens. An asymmetrical lens, however, may be configured to produce a magnetic field that rises sharply just in front of a conical pole piece near the bore of the lens or the position at which the electron beam exits the magnetic lens. The magnetic field falls slowly toward a second pole piece or a magnetic housing. The specimen and the conical pole piece are disposed within the magnetic housing such that the specimen may be placed near the conical pole piece. Asymmetric immersion lenses may be more flexible to accommodate large specimen such as semiconductor substrates, but these lenses may have a reduced capability to detect secondary electrons. For example, because secondary electrons may be emitted at a point beyond the magnetic field peak, low energy secondary electrons may not be able to surmount the magnetic field maximum. In order to overcome low detection of secondary electrons, a conducting grid system may be included in the lens. The conducting grid system may include an auxiliary grid to accelerate the secondary electrons away from the inner surface of the lower pole piece, an extraction grid to reduce the axial velocity of the secondary electrons, and a restrain grid to turn back any uncollected secondary electrons. Therefore, in order to overcome the low detection of secondary electrons, a conducting grid system may be included in the lens.

In addition to the above disadvantages, the performance of magnetic lenses may also be limited due to changes in the magnetic field strength due to low frequency noise, drift in the performance of current drive electronics, drift due to eddy currents or superimposed fields from other sources, and drift in the magnetic field strength over time from other causes. Although a magnetic lens design may minimize these effects on the performance of the lens, it may not be possible to substantially eliminate magnetic field drift of the lens. For example, eddy currents due to magnetic flux leakage from a lens through a gap in the magnetic lens may adversely affect the performance of the magnetic lens. Because a magnetic lens must be designed with a bore to allow the electron beam to travel through the lens, however, it is impossible to seal the magnetic lens off completely. As a result, some of the magnetic field will inherently "leak" out of a magnetic lens. Therefore, the effects of eddy currents on the performance of a magnetic lens may not be completely eliminated due to usage requirements. Drift in the magnetic field may cause the electron beam to drift out of focus. Therefore, the overall resolution of a scanning electron microscope may also be reduced by the presence of the above sources of magnetic field drift. The functioning of the scanning electron microscope may, however, be dramatically improved by an accurate control system for the magnetic objective lens.

A control mechanism for a magnetic lens may generally include a device for sensing the current density of the electron beam at a position spaced from an axis along which an electron beam travels. For example, an alignment yoke disposed along the axis of the electron beam may receive a signal from the current sensing arrangement. Therefore, the alignment yoke may be mechanically shifted incrementally and orthogonally until a maximum current may be produced at the reference location. The beam may be centered due to the altered position of the alignment yoke thereby reducing aberrations in the projections lens. An example of such a focusing system is illustrated in U.S. Pat. No. 4,423,305 to Pfeifer and is incorporated by reference as if fully set forth herein. Mechanical focus methods, however, may be slow due to the time required for moving the devices. In addition, microscopic vibrations due to mechanical motion of the alignment yoke may need to settle before the magnetic lens may perform adequately. Therefore, mechanical focus methods may require additional time such that microscopic vibrations will not affect the performance of the magnetic lens.

An alternative control mechanism for a magnetic lens involves focusing and controlling an electron beam by determining the focal length at which a sample will be brought into focus. Focal length may be a function of the electron beam energy and the magnetic field strength. In this manner, one available control mechanism involves using an electron trajectory tracing program to measure the converging point, or focal length, for an electron beam by using measurements of the electron beam energy and the magnetic field strength. The magnetic field strength may be estimated by measuring a current in the lens coil. An adjustment to the current in the lens coil may be made to correct the converging point of the electron beam. Instantaneous magnetic field strength, however, may be determined by the present current and the history of all other currents in the coil which is commonly referred to as hysteresis. Hysteresis in the magnetic field strength may also be induced from frequent changes in the voltage supplied to a magnetic lens. For example, the lens current in a scanning electron microscope may often be automatically adjusted to a nominal beam voltage. As new specimens are being observed, the user may usually alter the beam voltage to bring the specimen into focus. Therefore, frequently adjusting the beam voltage may increase the complexity of a current history of the lens. As the complexity of the current history increases, hysteresis will also become more problematic. Therefore, estimating the magnetic field strength using measurements of the current in the lens coil may induce error in this method. In addition, the coil and the core materials may react in a non-ideal way to the frequent changes in the current being supplied to the coil. Therefore, additional electrical and magnetic characterization of the coil and the core materials may be necessary. A thorough degaussing procedure may reduce the effects of hysteresis, however, magnetic hysteresis typically remains a problem in most magnetic lenses.

Additional methods to control the electron beam focus have attempted to reduce the effects of hysteresis of the magnetic lens by keeping the lens current constant after an initial manual focus and calibration. An example of such a magnetic lens control method is illustrated in U.S. Pat. No. 4,999,496 to Shaw et al. and is incorporated by reference as if fully set forth herein. The control method involves varying the electron beam energy to alter the focus of the magnetic lens, as working distance changes such as when different areas of a specimen are viewed. In order to offset the effects of a new beam energy, the current in the scanning coils may be altered to maintain accurate magnification. Although such a method for focusing the electron beam may reduce deleterious effects of hysteresis in the current of the magnetic objective lens, other factors that may lead to defocusing may not be addressed in this design. For example, as mentioned above, other factors that may hinder the performance of a magnetic lens may include thermal changes in the material properties, drift in the current drive electronics, drift in the magnetic field due to eddy currents, and drift due to superimposed fields from other sources.

Furthermore, in many scanning electron microscope systems, coarse and fine focusing of the magnetic lens may typically be performed manually by an operator. The operator may alter the focus of the magnetic lens by controlling the electric current of the magnetic lens. In order to obtain the desired magnetic field strength, the operator may alter the current while observing the effects of the magnetic field on an image of a specimen until the optimal performance is achieved. The image may be observed using a display system such as a color or grayscale monitor. The resulting magnetic field, however, may follow a nonlinear relationship with the current due to hysteresis in the magnetic lens and the behavior of the coil and the core materials in response to the change in current. This iterative method also depends on operator judgement and is consequently subject to error. More importantly, the additional sources of magnetic field drift described above may also cause this magnetic field to be irreproducible.

Accordingly, it would be advantageous to improve the performance of magnetic lens and a magnetic lens control apparatus that may be used to focus an electron beam by reducing the effects of, for example, hysteresis and thermal instability in the magnetic field strength of a magnetic lens.

SUMMARY OF THE INVENTION

In an embodiment, a magnetic lens such as a magnetic circuit configured to apply a magnetic field to a charged particle beam and an apparatus configured to control a magnetic field strength of a magnetic lens are provided. The charged particle beam may be a beam of ions or a beam of electrons. The charged particle beam may travel through the magnetic lens from a first end of the magnetic lens to a second end of the magnetic lens. The magnetic lens and the apparatus may be configured to be incorporated into a scanning electron microscope.

In an embodiment, the magnetic lens may have an outer pole piece and an inner pole piece. The outer pole piece may be coupled to the inner pole piece. The outer pole piece may have at least two sectors and at least two slots. In addition, the outer pole piece may have eight sectors and eight slots. Each sector may be disposed between lateral boundaries of two slots in the outer pole piece such that the magnetic potential of each sector may be substantially independent of the magnetic potential of each other sector on the outer pole piece. Furthermore, the inner pole piece may also have at least two sectors and at least two slots. In addition, the inner pole piece of the magnetic lens may have eight sectors and eight slots.

In an embodiment, the magnetic lens may include a primary coil winding. The primary coil winding may be interposed between the outer pole piece and the inner pole piece of the magnetic lens. The primary coil winding may be configured to drive a magnetic potential of the outer pole piece relative to the inner pole piece when a current is applied to the primary coil winding. The magnetic lens may also include at least two sector coil windings. Each sector coil winding may be coupled to one sector of the outer pole piece. In addition, if the inner pole piece also has sectors, then a sector coil winding may be coupled to each sector of the inner pole piece. In this manner, the magnetic lens may have an equal number of sectors and sector coil windings. Each sector coil winding may be configured to drive a magnetic potential of the sector coupled to each sector coil winding, respectively, when a current is applied to each sector coil winding. Therefore, the magnetic potential of each sector may include the magnetic potential generated by the current applied to primary coil winding which may affect each sector substantially equally. The magnetic potential of each sector may also include the magnetic potential generated by the current applied to each respective sector coil winding. As such, each sector may have a magnetic potential that may be substantially independent of the magnetic potentials of the other sectors of the magnetic lens. The magnetic field that may be applied to the charged particle beam, therefore, may include the magnetic potential of the outer pole piece relative to the inner pole piece and the magnetic potential of one or more sectors of the magnetic lens.

In an embodiment, a method for applying a magnetic field to a charged particle beam may include directing the charged particle beam through a magnetic lens. Directing the charged particle beam may include positioning a charged particle beam source configured to generate a charged particle beam in substantial alignment with a first end of the magnetic lens. The charged particle beam may travel from a first end of the magnetic lens to a second end of the magnetic lens. The magnetic lens may be configured as described in an above embodiment. The method may also include applying a first current to a primary coil winding of the magnetic lens to drive a magnetic potential of an outer pole piece of the magnetic lens relative to an inner pole piece of the magnetic lens. In addition, the method may include applying a second current to at least one sector coil winding of the magnetic lens to drive a magnetic potential of at least one sector of the magnetic lens. Therefore, the magnetic field that may be applied to the charged particle beam may include the magnetic potential of the outer pole piece relative to the inner pole piece and the magnetic potential of at least one sector of the magnetic lens.

In an embodiment, a method for focusing a charged particle beam on a specimen is provided. The specimen may be a semiconductor device that may be fabricated using a semiconductor fabrication process. Alternatively, the specimen may be a portion of a semiconductor device or another specimen such as a biological sample. The method may include positioning at least a portion of the specimen in a path of the charged particle beam. The charged particle beam may be directed through a magnetic lens from a first end of the magnetic lens to a second end of the magnetic lens. The magnetic lens may be configured as described in an above embodiment. Focusing a charged particle beam on a specimen may also include applying a first current to a primary coil winding of the magnetic lens to generate a magnetic potential of an outer pole piece of the magnetic lens relative to an inner pole piece of the magnetic lens. In addition, focusing a charged particle beam on a specimen may include applying a second current to one sector coil winding of the magnetic lens to generate a magnetic potential of one or more sectors of the outer pole piece of the magnetic lens. In this manner, the magnetic field that may be applied to the charged particle beam may include the magnetic potential of the outer pole piece relative to the inner pole piece and the magnetic potential of one or more sectors of the magnetic lens. The method may also include altering the magnetic potential of the outer pole piece to apply a coarse focus adjustment to the charged particle beam. Furthermore, the method may include altering the magnetic potential of one or more sectors to apply a fine focus adjustment to the charged particle beam.

In an embodiment, a system that may be used to inspect a semiconductor device is provided. The semiconductor device may be fabricated on a semiconductor substrate using a semiconductor manufacturing process. The system may be a scanning electron microscope that may use an electron beam to inspect the semiconductor device. The system, however, may be any system that may use a charged particle beam such as a beam of electrons or a beam of ions to inspect a semiconductor device. The system may include a charged particle beam source configured to generate a charged particle beam. The system may also include at least one magnetic lens that may be configured as described herein to apply a magnetic field to the charged particle beam. The magnetic lens may be positioned along a path of the charged particle beam generated by the charged particle beam source. As such, the charged particle beam may pass through the magnetic lens from a first end of the magnetic lens to a second end of the magnetic lens. The system may further include a stage configured to support at least a portion of the semiconductor device. The stage may be positioned along the path of the charged particle beam such that the charged particle beam may interact with the semiconductor device. The charged particle beam may interact with the semiconductor device subsequent to having a magnetic field applied to the charged particle beam by the magnetic lens.

In an additional embodiment, a method for inspecting a specimen such as a semiconductor device is provided. Inspecting the specimen may include positioning at least a portion of the specimen on a stage. The stage may be configured to support the specimen and may be positioned along a path of the charged particle beam. The method may include generating a charged particle beam. The generated charged particle beam may be directed through at least one pole piece of a magnetic lens such that the charged particle beam may travel from a first end of the magnetic lens to a second end of the magnetic lens. The magnetic lens may be configured as described herein and may be incorporated into a scanning electron microscope. The method may further include applying a first current to a primary coil winding to generate a magnetic potential of an outer pole piece of the magnetic lens relative to an inner pole piece of the magnetic lens. In addition, the method may include applying a second current to a sector coil winding of the magnetic lens to generate a magnetic potential of at least one sector of the outer pole piece. Therefore, the magnetic field applied to the charged particle beam may include the magnetic potential of the outer pole piece and the magnetic potential of one or more sectors of the outer pole piece.

An additional embodiment relates to a computer-implemented method for controlling a magnetic field that may be applied to a charged particle beam. The computer-implemented method may be implemented by controller software that may be executable on a controller computer. The controller computer may be coupled to a magnetic lens. The method for controlling a magnetic field may also be implemented by program instructions that may be incorporated into a carrier medium. The method may include measuring a magnetic field generated within a magnetic lens that may be configured as described herein. The charged particle beam may be directed through the magnetic lens such that the magnetic field of the magnetic lens may be applied to the charged particle beam.

The method may also include determining a primary current in response to the measured magnetic field. The primary current may be applied to a primary coil winding that may be coupled to a pole piece of the magnetic lens. In this manner, a magnetic potential of the pole piece may be generated. In addition, the method may include determining a secondary current in response to the measured magnetic field. The secondary current may be applied to at least one sector coil winding coupled to one sector of the pole piece. As such, a magnetic potential of each sector of the pole piece may be generated. Therefore, the magnetic field applied to the charged particle beam may include the magnetic field strength of the pole piece of the magnetic lens and the magnetic field strength of one or more sectors of the magnetic lens. The method may further include controlling the applied primary current and the applied secondary current. Controlling the applied primary current and the applied secondary current may be performed while the magnetic lens is being used.

In an embodiment, an apparatus configured to control a magnetic field strength of a magnetic lens is provided. The apparatus may include a magnetic sensor disposed within a magnetic field generated by the magnetic lens. The magnetic sensor may be configured to generate an output signal that may be responsive to a first magnetic field strength of the magnetic lens. The apparatus may also include a control circuit that may be coupled to the magnetic sensor and the magnetic lens. The control circuit may be configured to receive the output signal from the magnetic sensor and an input signal that may be responsive to a predetermined magnetic field strength. A manually-controlled operating system or a computer-controlled operating system may be coupled to the apparatus and may be configured to generated the input signal. In addition, the control circuit may be configured to generate a control signal that may be responsive to the output signal and the input signal. Furthermore, the control circuit may be configured to apply a current to the magnetic lens. The current may be responsive to the control signal. Therefore, the applied current may be effective to generate a second magnetic field strength within the magnetic lens. The second magnetic field strength may be closer to the predetermined magnetic field strength than the first magnetic field strength. In addition, the second magnetic field strength may be approximately equal to the predetermined magnetic field strength.

In an embodiment, a magnetic lens such as a magnetic lens as described herein may be configured to apply a magnetic field to a charged particle beam. The magnetic lens may be positioned along a path of the charged particle beam such that the charged particle beam may pass through the magnetic lens. The charged particle beam may be an electron beam or an ion beam. As such, the apparatus as described herein and the magnetic lens may be coupled to a system such as a scanning electron microscope. The system may also include a charged particle beam source that may be used to produce the charged particle beam. In addition, the system may further include a stage configured to support at least a portion of a specimen. The stage may also be positioned along a path of the charged particle beam such that the charged particle beam may interact with the specimen. The apparatus and the magnetic lens may, therefore, be used to inspect a specimen such as at least a portion of a semiconductor device, which may be fabricated by using a semiconductor fabrication process.

In an additional embodiment, a method for controlling a magnetic field strength of a magnetic lens is provided. The method may be performed substantially continuously or substantially intermittently. The method may include generating an output signal in response to a first magnetic field strength generated by the magnetic lens. The method may also include receiving an input signal. The input signal may be generated in response to a predetermined magnetic field strength. Furthermore, the method may include generating a control signal in response to the output signal and the input signal. Additionally, the method may also include applying a current to the magnetic lens. The applied current may be applied in response to the control signal.

In a further embodiment, a method for inspecting a specimen is provided. The specimen may include at least a portion of a semiconductor device. The specimen may be positioned along a path of the charged particle beam by a stage configured to support the specimen. The method may include generating a magnetic field by a magnetic lens and applying the magnetic field to a charged particle beam. Applying the magnetic field to the charged particle beam may include directing the charged particle beam through the magnetic lens. The charged particle beam may be an electron beam or an ion beam. The charged particle beam may be generated by using a charged particle beam source. Therefore, the magnetic lens may be coupled to a system such as a scanning electron microscope. In addition, the method may include controlling a magnetic field strength of the magnetic lens as described in the above embodiment.

BRIEF DESCRIPTION OF THE DRAWINGS

Other objects and advantages of the invention will become apparent upon reading the following detailed description and upon reference to the accompanying drawings in which.

Figure 1:
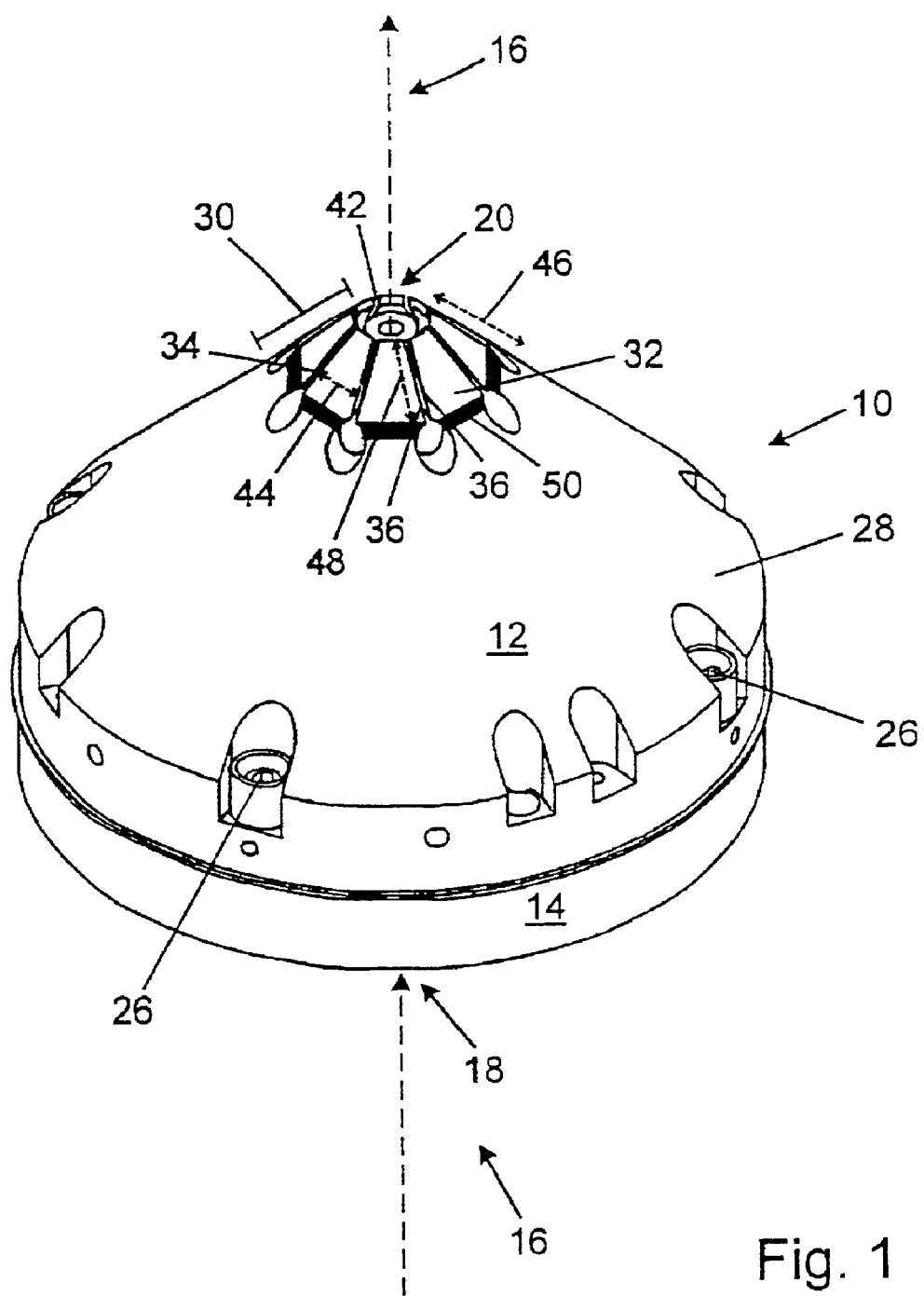
FIG. 1 depicts a perspective view of an embodiment of a magnetic lens including a pole piece having eight sectors and eight slots.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENTS

Figure 2:
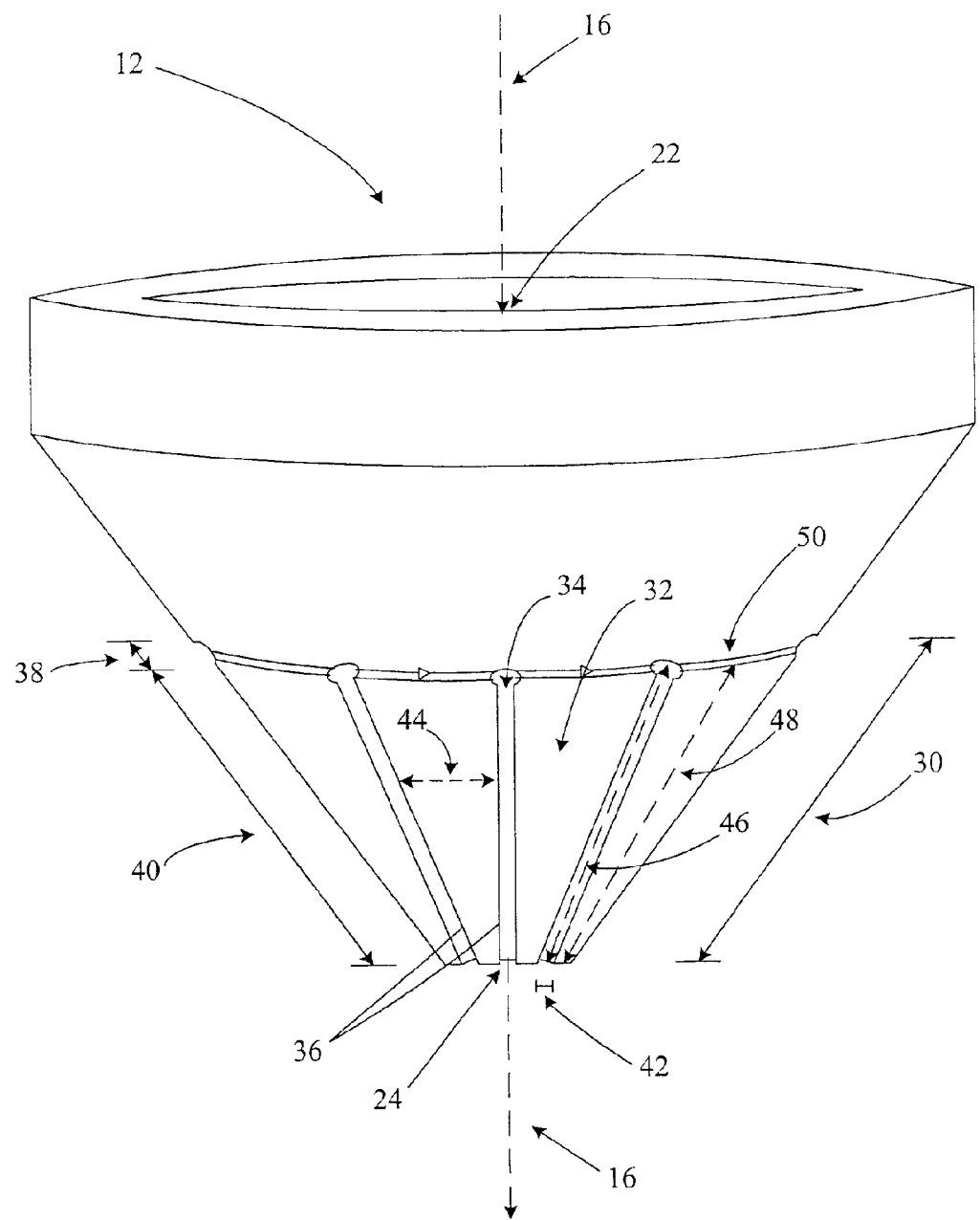
FIG. 2 depicts a side view of an embodiment of a pole piece that has eight sectors and eight slots.

Turning now to the drawings, FIG. 1 illustrates a perspective view of an embodiment of a magnetic lens. As used herein, a "magnetic lens" is generally defined as a magnetic circuit configured to apply a magnetic field to a charged particle beam. Magnetic lens 10 may have outer pole piece 12 coupled to inner pole piece 14. FIG. 2 further illustrates a side view of an embodiment of outer pole piece 12 of magnetic lens 10. Further description of magnetic lens 10 and outer pole piece 12 will be made with respect to both FIGS. 1 and 2. A charged particle beam (not shown) may be configured to travel through the magnetic lens along axis 16 from first end 18 of magnetic lens 10 to second end 20 of magnetic lens 10. The charged particle beam may include an electron beam or an ion beam. First end 18 and second end 20 of magnetic lens 10 may form two ends of a channel through the magnetic lens along axis 16 through which the charged particle beam may pass during operation. The charged particle beam may also, therefore, effectively travel through the outer pole piece along axis 16 from a first end 22 of the outer pole piece to second end 24 of the outer pole piece. Axis 16 of outer pole piece 12 may be substantially the same as axis 16 of magnetic lens 10.

Magnetic lens 10 may be configured to apply a magnetic field to the charged particle beam in order to alter and/or control the path of the charged particle beam through the magnetic lens. As such, magnetic lens 10 may be configured to operate as a magnetic objective lens that may be incorporated into any device that uses a charged particle beam during operation. Examples of such devices include, but are not limited to, scanning electron microscopes, tunneling electron microscopes, e-beam lithography tools, and focused ion beam inspection tools. Magnetic lens 10 may, however, be incorporated into any device that uses an applied magnetic field to alter the direction of a charged particle beam.

The two pole pieces, 12 and 14, may be coupled such that a negligible air gap is formed between the two pole pieces. Minimizing the air gap between the two pole pieces may be advantageous to reduce gap deflection flux leakage, or magnetic flux that may escape through an air gap between the pole pieces. Such air gaps may induce eddy currents in the outer pole pieces and the lens coil. In addition, thin circular shielding rings of a magnetic material may be placed in a gap between the inner pole piece and the outer pole piece of the magnetic lens to further minimize gap deflection flux leakage.

Outer pole piece 12 and inner pole piece 14 may be formed from a magnetically "soft" material such as ferrite, iron, holium metal, or other suitable material having a high magnetic permeability with minimum hysteresis. Inner pole piece 14 may be coupled to outer pole piece 12 by screws 26, or other suitable connecting devices. The connecting device may be made of non-magnetic materials. Alternatively, the two pole pieces may be connected by a physically soft material such as a silicone-based polymeric material that may flex radially to accommodate differential thermal expansion between the materials of the magnetic lens. Connecting the pole pieces using a physically soft connecting material, which is non-magnetic, may reduce fluctuations in the magnetic field of the magnetic lens as the temperature of the magnetic lens varies due to heat generated by the magnetic lens during operation. The variations in temperature due to heat generated during operation may also be reduced by cooling the magnetic lens through evaporation cooling or by forced cooling of the lens by circulating a cooling fluid proximate the magnetic lens.

Exterior surface 28 of outer pole piece 12 may have a substantially conical shape tapering outward from second end 24 of the pole piece. The conical shape of exterior surface 28 may be advantageous, for example, to minimize the distance between the bore, depicted as the opening in second end 20, of magnetic lens 10 and a specimen along a path of the charged particle beam. Therefore, the distance that a charged particle beam travels external to the applied magnetic field may be reduced, and even minimized. Consequently, the charged particle beam that impinges upon a specimen may more accurately reflect the characteristics of the beam within the magnetic lens. Furthermore, the conical shape of exterior surface 28 also increases the amount of space which is available for other elements coupled to a system with the magnetic lens. In a scanning electron microscope, for example, a stage configured to support a specimen may be positioned in the path of the electron beam proximal second end 20 of magnetic lens 10. The stage may also be tilted to provide different angles for scanning the charged particle beam across the sample. Therefore, a magnetic lens having a conical shape may reduce the restrictions on the mechanical devices that may be used in a scanning electron microscope and the restrictions to the functioning of these mechanical devices. Exterior surface 28, however, may also have a substantially cylindrical shape across outer pole piece 12. Additionally, exterior surface 28 may also have a partially conical shape and a partially cylindrical shape. Similarly, inner pole piece 14 may also have an exterior shape which is conical, cylindrical, or a combination of the two shapes. The exterior shapes of both pole pieces should be designed, however, to facilitate connection of the pole pieces while minimizing any gap which may be formed between the pole pieces.

Portion 30 of outer pole piece 12 may have a number of sectors 32 and a number of slots 34. Each sector 32 may be defined as the portion 30 of outer pole piece 12 disposed between lateral boundaries 36 of two slots 34. Slots 34 may be configured to extend through substantially the entire thickness of outer pole piece 12, from exterior surface 28 of outer pole piece 12 to an interior surface (not shown) of outer pole piece 12. Slots 34, however, may also extend partially into outer pole piece 12 from exterior surface 28. Furthermore, first portion 38 of slots 34 may extend through substantially the entire thickness of outer pole piece 12, while second portion 40 of slots 34 may partially extend into outer pole piece 12. As such, the second potion of slots 34 may provide a space for coil windings configured to encircle each sector through adjacent slots.

Outer pole piece 12 may have eight sectors 32 and eight slots 34. The number of sectors on the pole piece may be larger or smaller, however, depending upon the desired performance of the magnetic lens. For example, a pole piece having only two sectors and two slots may substantially enhance the performance of the magnetic lens in comparison to the performance of a magnetic lens that does not have sectors. Sectors 32 and slots 34 may also be formed in inner pole piece 14 (not shown). In this manner, outer pole piece 12, inner pole piece 14 or both pole pieces of magnetic lens 10 may have a number of sectors and slots. Sectors 32 and slots 34 may be arranged around substantially the entire portion 30 of outer pole piece 12. Alternatively, sectors 32 and slots 34 may be arranged around only a fraction of portion 30 of outer pole piece 12.

Slots 34 may be spaced evenly around outer pole piece 12. For example, if outer pole piece 12 has eight slots, then a slot may be located every forty five degrees on outer pole piece 12. Alternatively, slots 34 may also have an uneven spatial arrangement around outer pole piece 12. Lateral boundaries 36 surrounding slots 34 define a lateral length 42 of each slot. In this manner, each slot 34 may have substantially the same lateral length 42. Lateral length 42 of each slot 34 may also be substantially smaller than a lateral length 44 of sectors 32. Lateral length 44 of sectors 32 may be defined as a length of each sector 32 disposed between two slots 34, and the lateral length 44 of each sector 32 may also be substantially equal. Alternatively, lateral length 44 of each sector 32 may vary from sector to sector.

Slots 34 may extend vertical length 46 from second end 24 of outer pole piece 12 across portion 30 of outer pole piece 12. Vertical length 46 of slots 34 may be larger or smaller depending on the design characteristics of magnetic lens 10. Each slot 34 may have substantially the same vertical length 46, and vertical length 46 may be substantially equal to vertical length 48 of each sector 42. Vertical length 48 of sectors 32 may also be defined as a length of sector 32 extending across portion 30 of outer pole piece 12 from second end 24 of the pole piece. Therefore, each sector 32 may also have a vertical length 48 that may be substantially equal to vertical length 48 of the other sectors.

Figure 6A:
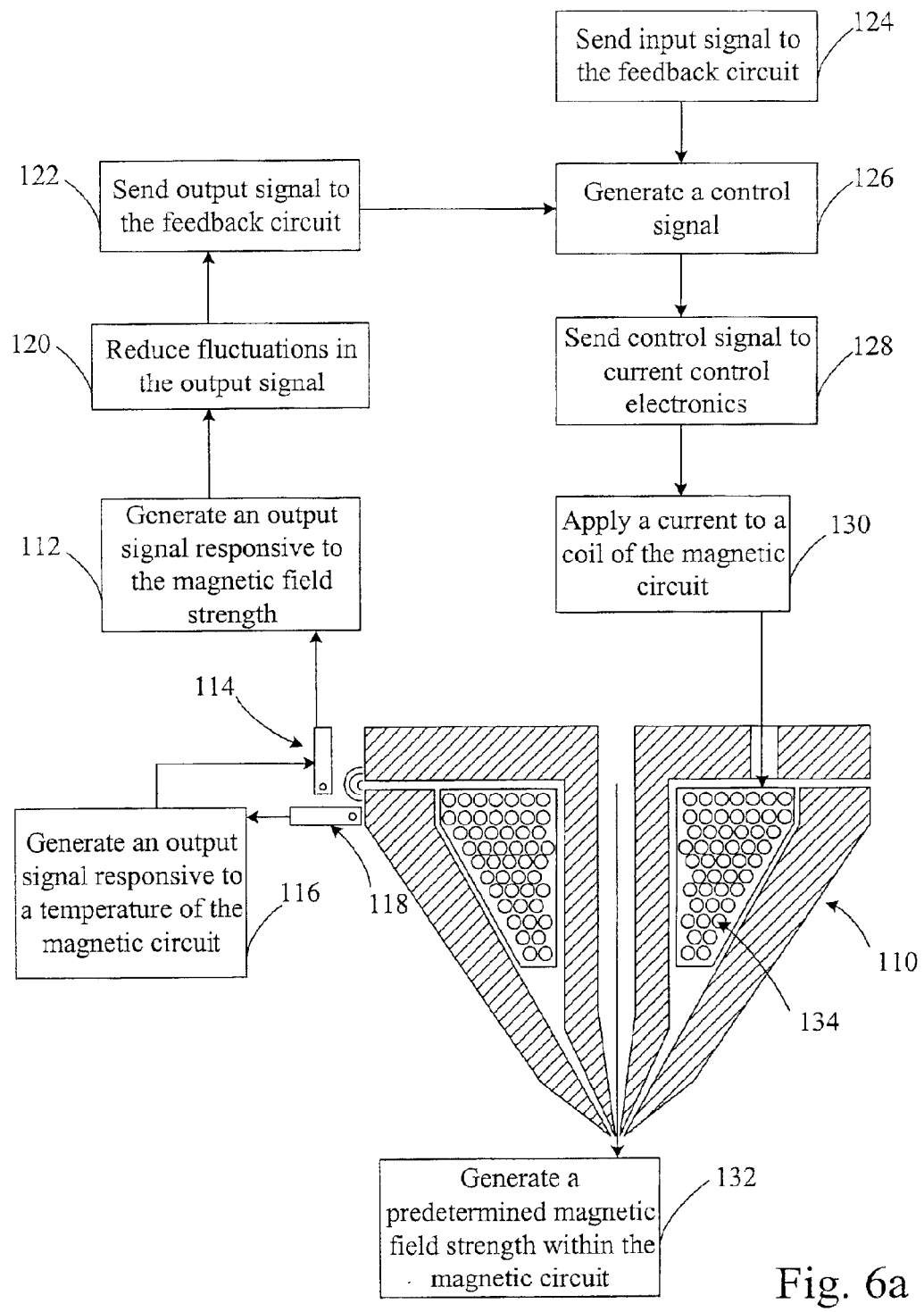
FIG. 6a depicts a flow chart of an embodiment of a method for controlling a magnetic field of a magnetic lens in which a magnetic sensor is disposed within a magnetic fringe field area of a magnetic lens.

A primary coil winding (as shown in FIG. 6*a* as primary coil winding 134 disposed within magnetic lens 110) may also be disposed within magnetic lens 10 and may be interposed between outer pole piece 12 and inner pole piece 14. As such, the primary coil winding may be disposed within a cavity formed between outer pole piece 12 and inner pole piece 14. The primary coil winding may be configured to generate a magnetic potential, $\Phi_o$, of outer pole piece 12 relative to a magnetic potential of inner pole piece 14 when a current, $I_o$, is applied to the primary coil winding. The primary coil winding may be a number of turns of a conductive wire. The number of turns of the conductive wire may be approximately 100 to approximately 1000. The number of turns of the coil may be larger or smaller, however, depending on, for example, the intended use for the magnetic lens. The primary coil winding may be formed of an electrically conductive wire, such as copper, anodized aluminum, or other suitable material. The primary coil winding may also be cooled by various means during operation in order to reduce the heat generated by the coil by evaporation cooling or by forced cooling involving circulating a cooling fluid proximate the primary winding coil.

Magnetic lens 10 may also have a number of sector coil windings 50. Each sector coil winding 50 may be coupled to one sector 32 of magnetic lens 10. Each sector coil winding 50 may be wound through opening formed in outer pole piece 12 by two adjacent slots 34. As such, each sector coil winding 50 may be arranged to encircle one sector 32 of the magnetic lens. The sector coil winding may, therefore, encircle a portion of the sector or substantially the entire sector and may also include a number of turns of a conductive wire. The number of turns of the conductive wire may be configured to encircle the sector in a direction substantially perpendicular to the path of the charged particle beam through the magnetic lens. The number of turns for each sector coil winding may be smaller than the number of turns for the primary coil winding. The sector coil winding may also be formed of an electrically conductive material and may also be cooled during operation as described above.

The magnetic potential of each sector 32 may be first established by the magnetic potential $\Phi_o$, of outer pole piece 12 generated by the primary coil winding. Therefore, when a current is applied to the primary coil winding, a magnetic potential of outer pole piece 12 relative to inner pole piece 14 may be generated, which may be applied approximately equally to each sector 32 of magnetic lens 10. Current, $I_i$, may also be passed through each sector coil winding 50 to generate a magnetic potential, $\Phi_i$, for each sector 32 of magnetic lens 10. A magnetic potential may, therefore, also be individually generated on each sector 32 of magnetic lens 10. The resulting magnetic potential on the $i^{th}$ sector, $\Phi_i$, may, therefore, be approximately equal to the sum of the magnetic potential resulting from the current applied to the primary coil winding, $\Phi_o$, and the magnetic potential resulting from the current applied to each sector coil winding, $\Delta\Phi_1$, or $\Phi_i = \Phi_o + \Delta\Phi_i$, where $\Delta\Phi_i$ is approximately proportional to the current applied to the sector winding, $I_i$. As such, the magnetic field which may be applied to the charged particle beam may include the magnetic potential of outer pole piece 12 relative to inner pole piece 14 and a magnetic potential of each sector 32 of outer pole piece 14.

In addition, current $I_i$ passed through each sector coil winding 50 may include the zero, first, and second order harmonics which may be expressed by the following equation: $I_i = A*\cos(0*i) + B*\cos(\pi/4*i+\beta) + C*\cos(\pi/2*i+\gamma)$. The quantity "A" may represent the magnitude of the fine adjustment of the focus strength of the magnetic lens which is applied to the magnetic lens by the magnetic potential generated by the $i^{th}$ sector. The quantity "B" may represent the amount of magnetic axis displacement in the magnetic lens which is applied to the magnetic lens by the magnetic potential generated by the $i^{th}$ sector, and "β" may represent the direction of the magnetic axis displacement. The quantity "C" may represent the strength of the stigmation of the magnetic lens which is applied to the magnetic lens by the magnetic potential generated by the $i^{th}$ sector, and "γ" may represent the direction of the stigmation axis. Therefore, the magnetic potential generated on each sector of the pole piece may be used to adjust the focus strength of the magnetic lens, the amount of magnetic axis displacement of the magnetic lens, and/or the strength of stigmation of the magnetic lens. In this manner, a current may be applied to each sector coil winding of the magnetic lens to alter the magnetic potential applied to the charged particle beam.

The performance of a magnetic lens may be substantially enhanced by incorporating sectors on at least one pole piece of the magnetic lens. For example, altering the magnetic potential of the magnetic lens by generating individual magnetic potentials for each sector that are coupled to separate sector coil windings may enable the symmetry of magnetic lenses to be broken in a controlled fashion. The potential advantages of such a magnetic lens include improved capability to make fine adjustments to the focusing strength of the magnetic field. Furthermore, a sectored magnetic lens may enable displacing the magnetic axis of the magnetic lens that may be useful for the purpose of aligning the lens axis with an off-axis charged particle beam in order to minimize aberrations in the charged particle beam. Displacing the magnetic axis may also allow any errors in the symmetry of the magnetic lens to be corrected in order to obtain a symmetric magnetic field. Being able to correct the symmetry of a magnetic lens may further reduce the rejection rate of magnetic lenses associated with magnetic lens manufacturing. Additionally, displacing the magnetic axis may be useful in producing a deflection of the charged particle beam to affect the trajectory of the charged particle beam. In this manner, a sectored magnetic lens may provide improved control over the landing position and the landing angle of the charged particle beam on a specimen or a detector. A stigmator field may also be produced using a magnetic lens having sectors on at least one pole piece, which may correct for other stigmating forces on the charged particle beam. Furthermore, because a sectored magnetic lens may be operated as a multi-pole device without inserting additional devices within the magnetic lens, the sectored magnetic lens also provides the benefits of a multi-pole device while maintaining a co-linear path for the charged particle beam. Therefore, an advanced magnetic lens design is provided without increasing the complexity of the overall optical design of a system in which the lens is incorporated.

A magnetic lens having at least one pole piece which includes at least two sectors may also be incorporated into a system configured to inspect a specimen such as a semiconductor device. Inspecting semiconductor devices is an important step in manufacturing a semiconductor device. Inspection of semiconductor devices may usually be performed to control and improve fabrication processes. Inspection may be performed after individual processes have been performed or after the entire device has been fabricated. In addition to semiconductor devices, inspection of substantially transparent reticles may also be performed during semiconductor manufacturing. Reticles may be used in lithography to transfer a pattern to a resist on a semiconductor substrate. Therefore, a defect in or on a reticle will also be transferred to the semiconductor device. As such, careful inspection of the reticle may usually be performed during manufacture of the reticle itself and during subsequent use in semiconductor device manufacturing.

As the dimensions of devices shrink, it is becoming increasingly difficult to successfully fabricate semiconductor devices. Therefore, it is also becoming increasingly important to monitor, control, and improve the performance of semiconductor fabrication processes. Analysis of fabrication processes, such as lithography and etch, may typically be performed by generating an image of the device and analyzing the semiconductor process by observing the image quality and measuring critical dimensions of features of the device. Due to reductions in feature sizes of a semiconductor device, an inspection tool that utilizes a charged particle beam to generate an image of a semiconductor device may generally be used to inspect the manufactured devices. Examples of such devices include scanning electron microscopes, tunneling electron microscopes and focused ion beam inspection devices.

Figure 3:
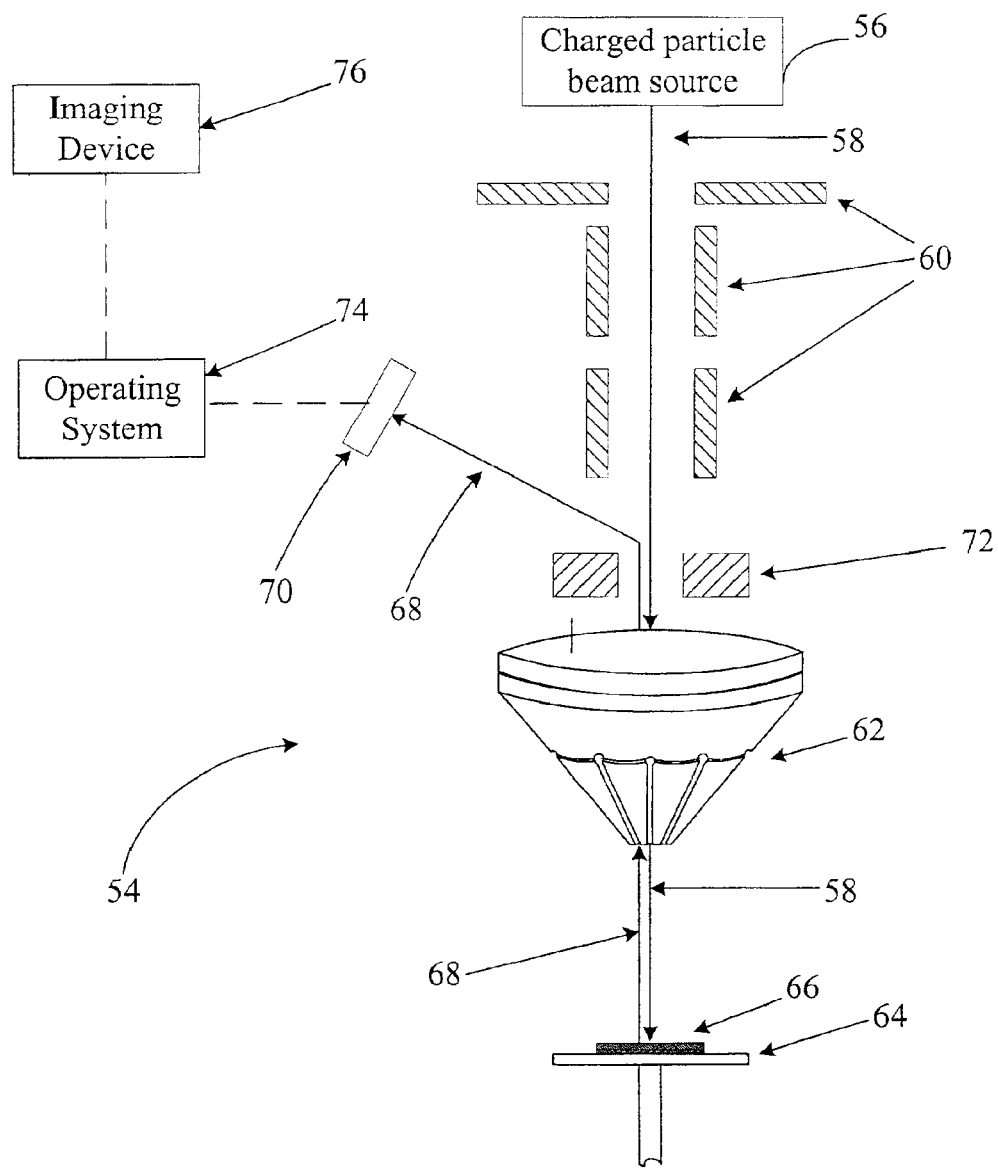
FIG. 3 depicts a schematic view of an embodiment of a system that includes at least one magnetic lens that has at least one pole piece having at least two sectors.

FIG. 3 illustrates an embodiment of a system configured to inspect a specimen. System 54 may include charged particle beam source 56, such as an ion beam or an electron beam, configured to generate charged particle beam 58. Charged particle beam source 56 may be any known in the art such as a cold field emission source or a thermal field emission source. System 54 may also include several positioning devices 60 located along the path of charged particle beam 58 and configured to direct the charged particle beam to a focusing device. Positioning devices 60 may include electrostatic or electromagnetic deflectors, beam-limiting apertures, Wien filters, and magnetic condenser lenses. Appropriate positioning devices, however, may vary depending upon, for example, the intended application for the system and may include any known in the art. The positioning devices may be configured to alter the path of the charged particle beam such that the charged particle beam may be substantially aligned with a first end of the magnetic lens. In addition, the positioning devices may also be configured to apply an initial correction to the charged particle beam to reduce effects such as chromatic aberrations, and/or dispersion in the energy of the charged particle beam.

System 54 may include at least one magnetic lens 62. Magnetic lens 62 may be positioned such that charged particle beam 58 may enter the magnetic lens at a first end of the magnetic lens and may exit the magnetic lens at a second end of the magnetic lens. A substantially co-linear void in the magnetic lens from the first end to the second end may provide an appropriate path for the charged particle beam. Therefore, magnetic lens 62 may be configured to apply a magnetic field to charged particle beam 58 as the charged particle beam travels through the magnetic lens. At least one pole piece of magnetic lens 62 may have at least two sectors and at least two slots. The sectors may be disposed between lateral boundaries of the slots in the pole piece. Magnetic lens 62 may have a primary coil winding disposed within the magnetic lens. The magnetic lens may also include a number of secondary coil windings, and each sector coil winding may be coupled to one sector of the pole piece. As such, the primary coil winding may be configured to generate a magnetic potential of the outer pole piece relative to the inner pole piece, and each secondary coil winding may be configured to generate a magnetic potential of one sector of the pole piece. The magnetic field applied to charged particle beam 58 by magnetic lens 62, therefore, may include the magnetic potential of the outer pole piece relative to the inner pole piece and the magnetic potential of at least one sector of the pole piece. The magnetic lens may be further configured as described herein. The magnetic lens may be also configured to operate as a magnetic objective lens to focus the charged particle beam onto a semiconductor device. Focusing the charged particle beam may include reducing aberrations in the charged particle beam and reducing the diameter of the charged particle beam to a spot size which is appropriate for imaging a semiconductor device.

System 54 may further include stage 64 configured to support at least a portion of specimen 66, which may include at least a portion of a semiconductor device formed on a semiconductor substrate, or a product wafer. Stage 64 may be positioned along the path of charged particle beam 58. The stage may be any mechanical device known in the art. For example, stage 64 may include a holder configured to engage a stud. The stud may include a horizontally flat upper surface configured to support the specimen and a post that may be substantially vertical to the upper surface. Semiconductor device 66 may be attached to a stud using an adhesive. The holder may be positioned in the path of the charged particle beam by additional mechanical devices and may include voids configured to engage the post of the stud. As such, the stud may be also be positioned in the path of charged particle beam when the stud is engaged within the holder. Alternatively, stage 64 may have a flat surface which may support specimen 66. The flat surface of the stage may also have small holes through which a vacuum source may be connected. In this manner, the stage may be configured to engage the specimen using a vacuum which may be generated by the vacuum source during operation. The stage may also be positioned in the path of the charged particle beam manually or by a mechanical device controlled by a controller computer.

Specimen 66 may also be positioned in the path of charged particle beam 58 such that the charged particle beam may interact with the specimen to generate a secondary beam of charged particles 68. Secondary beam of charged particles 68 may include secondary charged particles, which may emanate from recesses of the specimen, back-scattered charged particles, which may emanate from the surface of the specimen, and transmitted electrons, which may pass through the specimen, such as a substantially transparent reticle. System 54 may also include detector 70 or a plurality of detectors and at least one device 72 configured to direct the secondary beam of electrons to the detectors. Device 72 may include, for example, a Wien filter. The Wien filter, or other suitable device, may be configured to alter the path of the secondary electrons without affecting the path of the charged particle beam which is being directed to the semiconductor device. Detector 70 may be a Schottky solid state barrier detector, or other suitable detectors, and may also be coupled to operating system 74, which may be incorporated into the system. Operating system 74 may be configured to receive a signal from detector 70, to analyze the signal, and to generate information about characteristics of specimen 66 such as feature size. Operating system 74 may also be coupled to imaging device 76, which may be a cathode ray tube. In this manner, system 54 may also be configured to generate image profile characteristics of specimen 66. The characteristics of the device may be used to control and/or alter a process, which was used to fabricate the specimen. Additional features and devices that may also be incorporated into the system are illustrated, for example, in U.S. Pat. No. 4,928,010 to Saito et al., U.S. Pat. No. 5,241,176 to Yonezawa, U.S. Pat. No. 5,502,306 to Meisburger et al., U.S. Pat. No. 5,578,821 to Meisburger et al., U.S. Pat. No. 5,665,968 to Meisburger et al., U.S. Pat. No. 5,717,204 to Meisburger et al., U.S. Pat. No. 5,869,833 to Richardson et al., U.S. Pat. No. 5,872,358 to Todokora et al., and U.S. Pat. No. 5,973,323 to Adle and are incorporated by reference as if fully set forth herein.

Figure 4:
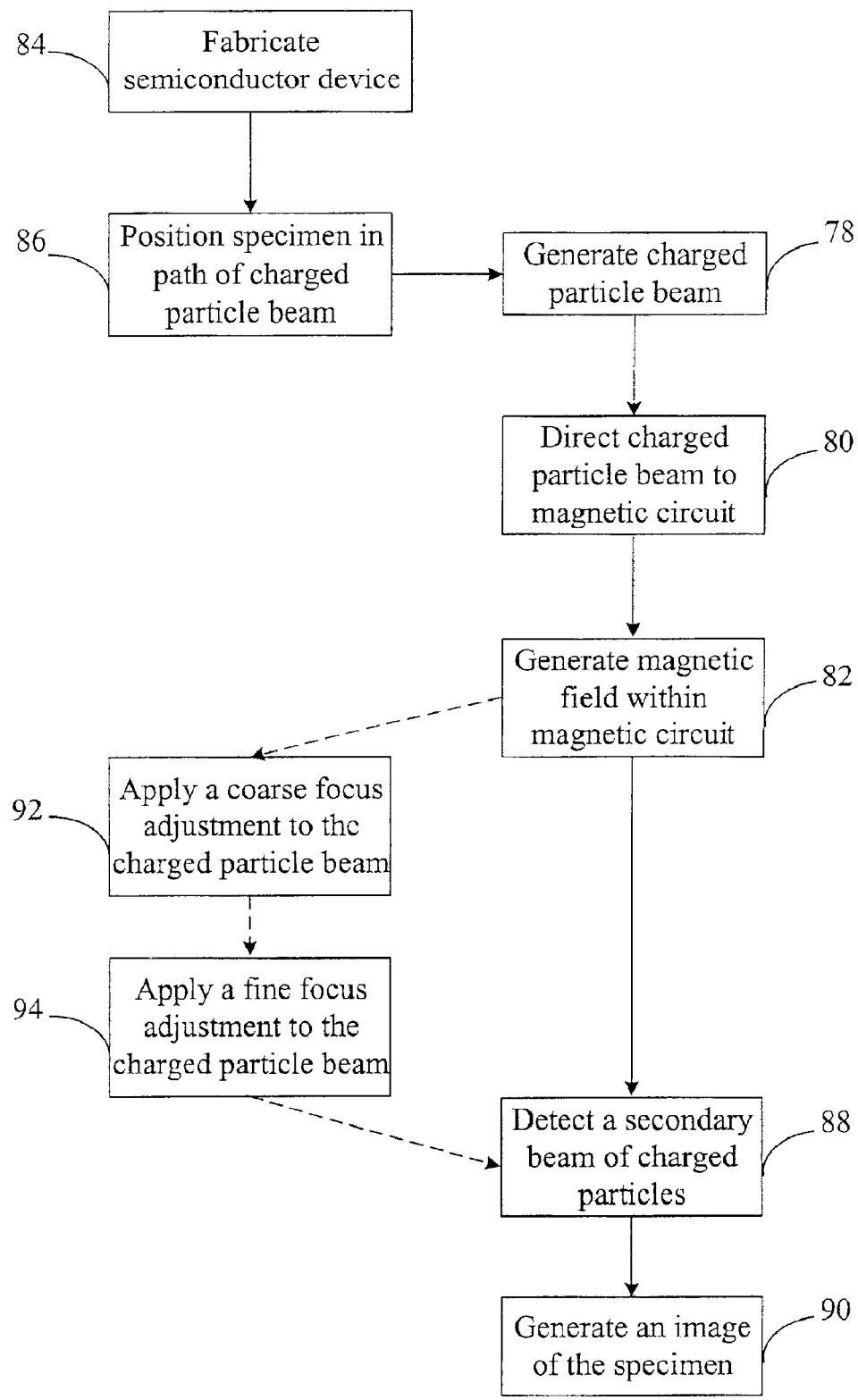
FIG. 4 depicts a flow chart of an embodiment of a method for applying a magnetic field to a charged particle beam using a magnetic lens that includes at least one pole piece having at least two sectors.

FIG. 4 illustrates an embodiment of a method for applying a magnetic field to a charged particle beam. As shown in step 78, a charged particle beam may be generated by supplying power to a charged particle beam source. The charged particle beam source may be any known in the art including a cold field emission source or a thermal field emission source. Additionally, the charged particle beam may include a beam of electrons or ions. The charged particle beam source may be disposed within an optical column, which may be held under vacuum conditions during operation. As shown in step 80, the charged particle beam may be directed to a first end of the magnetic lens by applying electrostatic or magnetic fields to the charged particle beam. For example, prior to traveling through the magnetic lens, the charged particle beam may be passed through several positioning devices located along the path of the charged particle beam. The positioning devices and the magnetic lens may also be incorporated into the optical column containing the charged particle beam source. As such, the positioning devices and the magnetic lens may be operated while the optical column is under vacuum conditions. Positioning devices may include electrostatic or electromagnetic deflectors, beam-limiting apertures, Wien filters and magnetic condenser lenses. The positioning devices may alter the path of the charged particle beam to substantially align the charged particle beam with a first end of the magnetic lens. In addition, the positioning device may also apply an initial correction to the charged particle beam to reduce effects such as chromatic aberrations, or dispersion in the energy of the charged particle beam.

The charged particle beam may be directed to the magnetic lens such that the charged particle beam may travel substantially through the magnetic lens which includes at least one pole piece. The charged particle beam may enter the magnetic lens at a first end of the magnetic lens and may exit the magnetic lens at a second end of the magnetic lens. The magnetic lens may be configured as described herein.

As shown in step 82, a magnetic field may be generated within the magnetic lens by driving a magnetic potential of the pole piece. For example, a first current may be applied to a primary coil winding coupled to the magnetic lens. A second current may also be applied to at least one sector coil winding coupled to a sector of the magnetic lens. In this manner, a magnetic potential of at least one sector of the magnetic lens may also be generated. Therefore, the magnetic field applied to the charged particle beam traveling through the magnetic lens may include the magnetic potential of the outer pole piece relative to the inner pole piece and the magnetic potential of at least one sector. The magnetic potential of at least one sector of the pole piece may alter the focus strength of the magnetic lens, the magnetic axis displacement of the magnetic lens, and/or the strength of stigmation of the magnetic lens. In this manner, the magnetic lens may have an enhanced capability to reduce aberrations in the charged particle beam.

In an additional embodiment, the method, as shown in FIG. 4, may include additional steps to focus a charged particle beam on a specimen. The specimen may include a semiconductor device, a feature or a level of a semiconductor device, or other suitable specimen such as a substantially transparent reticle configured to transfer a pattern to a resist in lithography, a photoresist layer suitable for e-beam lithography, or a biological sample. The specimen may also be an entire semiconductor substrate that has been processed using a semiconductor fabrication process or a portion of the semiconductor substrate. For example, a portion of a semiconductor substrate may be formed by cutting the substrate into segments at appropriate positions on the substrate. As such, a cross-sectional portion of semiconductor device, or other semiconductor feature of interest, may be exposed to the charged particle beam. An appropriate portion of the specimen may also be larger or smaller depending on the capability of the device coupled to the charged particle beam. As shown in step 84, a specimen such as a semiconductor device may be fabricated on a semiconductor substrate using a semiconductor manufacturing process. The semiconductor manufacturing process may be any process known in the art of semiconductor manufacturing, such as lithography, etch, ion implantation, deposition, chemical mechanical polishing, and/or plating.

At least a portion of the specimen may be positioned in the path of the charged particle beam prior to generating the charged particle beam, as shown in step 86. The specimen may be positioned in the path of the charged particle beam by placing the specimen on a stage. The stage may be located substantially within the optical column or proximal the optical column such that the stage and the specimen are also under vacuum conditions during operation. The stage may be configured to support the specimen such that a position of the specimen in the path of the charged particle beam may be maintained throughout a process. For example, the specimen may be attached to a stud using an adhesive. The stud may be configured as described herein. Alternatively, the stage may have a flat surface configured to support substantially the entire specimen such as a semiconductor substrate or product wafer. The flat surface of the stage may also have holes through which a vacuum may be pulled in order to retain the position of the specimen in the path of the charged particle beam. The stage, however, may also be any suitable mechanical device known in the art. The stage may also be positioned in the path of the charged particle beam manually or by a mechanical device that may be controlled by a controller computer.

In an additional embodiment, the method, as shown in FIG. 4, may include additional steps to detect at least one secondary beam of charged particles, as shown in step 88. The secondary beam of charged particles may be produced as a result of interactions between the charged particle beam and the specimen. The secondary beam of charged particles may include secondary charged particles, back-scattered charged particles, and/or transmitted charged particles. The secondary beam of electrons may be directed back through the magnetic lens. A device such as a Wien filter, which may generate an electrostatic field or a combination of electrostatic and magnetic fields, may be used to direct the secondary beam of charged particles to a detector or a plurality of detectors. As such, the Wien filter direct the secondary beam to a detector at a high angle of incidence from the original path of the secondary beam. The Wien filter, however, may apply the field to the secondary beam without affecting the trajectory of the charged particle beam, which may also pass through the Wien filter. The secondary beam of charged particles may then be detected by a Schottky solid state barrier detector, or other suitable detector. The detector may be configured to detect the secondary beam of charged particles and to generate a signal responsive to the secondary beam.

In an embodiment, an image of the specimen may be generated subsequent to detecting the secondary beam of charged particles, as shown in step 90. An operating system coupled to the detector may receive a signal generated by at least one detector. The signal from the detector may be responsive to the secondary beam of charged particles. The operating system may include a computer such as a personal computer or a mainframe computer, which may have an appropriate software package to perform an appropriate set of operations on the signal from the detector. As such, the operating system may analyze the signal from the detector and generate an output signal representative of an image of the specimen. An imaging system such as a cathode ray tube, which may be coupled to the operating system, may receive the output signal from the operating system and generate an image of the specimen. The image may be used to analyze physical characteristics of the specimen such as feature size and vertical profile quality. The physical characteristics of the device may then also be used to control and/or improve the a process which was used to fabricate the specimen.

In a further embodiment, the method as illustrated in FIG. 4 may also include applying a coarse focus adjustment to the charged particle beam, as shown in step 92. An initial magnetic potential may be generated within the magnetic lens by applying a current to a primary coil winding of the magnetic lens. The initial magnetic potential may also be generated within the magnetic lens by further applying a current to sector coil winding coupled to a sector of the magnetic lens. The initial magnetic potential may be a function of the magnetic potential generated by the primary coil winding and the magnetic potential generated by the sector coil winding as described above. The initial magnetic potential may adequately focus, or reduce aberrations in, the charged particle beam on a specimen in order to produce an image of the specimen. The image of the specimen may be generated as described in the above embodiments. For example, the image of the specimen may be generated by detecting at least one secondary beam of charged particles which may be result from interactions between the charged particle beam and the specimen. The image of the specimen may be observed using a imaging device such as a cathode ray tube.

The clarity of the image of the specimen may generally be dependent on the aberrations such as chromatic aberration and stigmation in the charged particle beam, which interacts with the specimen. Therefore, the initial magnetic potential may not sufficiently reduce aberrations in, or focus, the charged particle beam in order to obtain an adequate image of the specimen. In step 92, a coarse focus adjustment may be applied to the charged particle beam by altering the magnetic potential within the magnetic lens. The coarse focus adjustment may reduce aberrations in the charged particle beam, which are present despite the initial magnetic field. Altering the magnetic potential within the magnetic lens may include altering and/or controlling the current to the primary coil winding and the current to at least one sector coil winding using a manually-controlled device or a controller computer. The magnetic potential within the magnetic lens may also be altered by altering and/or controlling the current being applied to several sector coil windings using a manually-controlled device or a controller computer.

The manually-controlled device and the controller computer may both be coupled to the magnetic lens. For example, an operator may observe the image of the specimen generated by the initial magnetic potential of the magnetic field and may manually adjust the current being applied to the primary coil winding and the current being applied to at least one of the sector coil windings by using a manually-controlled device. The manually-controlled device may include a dial, or other suitable device, which may be coupled to the power supply of the primary coil winding or a sector coil winding. Alternatively, a controller computer may analyze a gray-scale image of the specimen generated by the initial magnetic potential of the magnetic field. The controller computer may alter the primary current applied to the primary coil winding and the current applied to at least one sector coil winding using a set of predefined mathematical equations.

After the coarse focus adjustment, the current being applied to the primary coil winding may generally remain constant. For example, the coarse focus adjustment may adequately reduce aberrations in the charged particle beam such that only fine adjustments to the charged particle beam may be required. Additionally, maintaining a constant current to the primary coil winding may simplify further operation of the magnetic lens. In step 94, a fine focus adjustment may also be applied to the charged particle beam by further altering the magnetic potential within the magnetic lens. Further altering the magnetic potential within the magnetic lens may include altering and controlling the current to at least one sector coil winding, or multiple sector coil windings, using a manually-controlled device or a controller computer. The manually-controlled device and the controller computer may both be coupled to the magnetic lens. As such, further altering of the magnetic potential within the magnetic lens may be performed using the manually-controlled device or the controller computer, as described in step 92. For example, an operator may manually adjust the current being applied to at least one of the sector coil windings by using a manually-controlled device. As described above, the manually-controlled device may include a dial, or other suitable device, which may be coupled to the power supply of at least one sector coil winding. Additional dials, or other suitable devices, may also be coupled to additional sector coil windings such that the current being applied to each sector coil winding may be controlled individually. Alternatively, a controller computer may automatically adjust the current being applied to at least one sector coil winding by using a set of predefined mathematical equations. The fine focus adjustment to the charged particle beam may include an adjustment to the magnitude of a focus strength of the magnetic lens, an adjustment to an amount of magnetic axis displacement of the magnetic lens, and/or an adjustment to a strength of stigmation of the magnetic lens. The fine focus adjustment may, therefore, generate a magnetic potential within the magnetic lens to reduce aberrations in the charged particle beam such that an adequate image of the specimen may be generated.

Furthermore, the methods for applying a magnetic field to a charged particle beam may be integrated into a controller for a magnetic lens. The controller may by a computer system configured to operate software to control the operation of the magnetic lens. The computer system may include a memory medium on which computer programs for operating the magnetic lens and performing calculations related to the data collected. The term "memory medium" is intended to include an installation medium, e.g., a CD-ROM, or floppy disks, a computer system memory such as DRAM, SRAM, EDO RAM, Rambus RAM, etc., or a non-volatile memory such as a magnetic media, e.g., a hard drive, or optical storage. The memory medium may include other types of memory as well, or combinations thereof. In addition, the memory medium may be located in a first computer in which the programs are executed, or may be located in a second different computer that connects to the first computer over a network. In the latter instance, the second computer provides the program instructions to the first computer for execution. Also, the computer system may take various forms, including a personal computer system, mainframe computer system, workstation, network appliance, Internet appliance, personal digital assistant (PDA), television system or other device. In general, the term "computer system" may be broadly defined to encompass any device having a processor that executes instructions from a memory medium.

The memory medium preferably stores a software program for the operation of the magnetic lens. The software program may be implemented in any of various ways, including procedure-based techniques, component-based techniques, and/or object-oriented techniques, among others. For example, the software program may be implemented using ActiveX controls, C++ objects, JavaBeans, Microsoft Foundation Classes (MFC), or other technologies or methodologies, as desired. A CPU, such as the host CPU, executing code and data from the memory medium includes a device configured to create and execute the software program according to the methods described above.

Various embodiments further include receiving or storing instructions and/or data implemented in accordance with the foregoing description upon a carrier medium. Suitable carrier media include memory media or storage media such as magnetic or optical media, e.g., a disk or CD-ROM, as well as signals such as electrical, electromagnetic, or digital signals, conveyed via a communication medium such as networks and/or a wireless link.

The software for the magnetic lens may be used to control the magnetic field applied to a charged particle beam. Preferably, predefined mathematical equations that describe the relationships between the magnetic potentials of the pole piece, the sectors of the pole piece and the current applied to each coil winding of the magnetic lens may be incorporated into the software. The software may be configured to measure a magnetic field generated within a magnetic lens. The magnetic lens may be configured as described herein. The software may also be configured to determine a primary current in response to the measured magnetic field, which may be applied to a primary coil winding coupled to a pole piece of the magnetic lens. The software may be further configured to determine a secondary current in response to the measured magnetic field, which may be applied to at least one secondary coil winding coupled to a sector of the outer pole piece. Additionally, the software may be configured to control the applied primary current and the applied secondary current. In this manner, the software may be configured to maintain a predetermined magnetic field within the magnetic lens or to correct for magnetic field drift within the magnetic field of the magnetic lens. Magnetic field drift may occur due to the performance of the electron beam source, hysteresis effects within the magnetic lens, temperature dependent properties of the magnetic lens, and/or drift caused by sources external to the magnetic lens.

Figure 5:
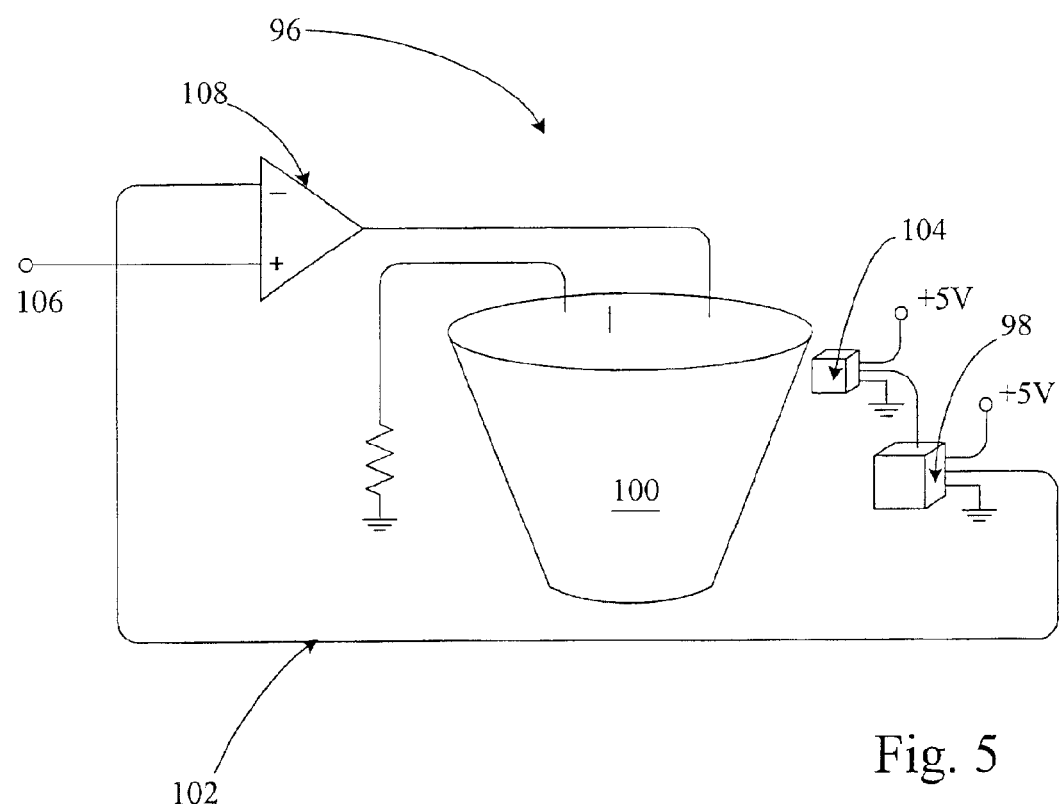
FIG. 5 depicts a schematic view of an embodiment of an apparatus configured to control a magnetic field of a magnetic lens.

FIG. 5 illustrates an embodiment of an apparatus configured to control a magnetic field strength, or the magnetic flux density, of a magnetic lens. Apparatus 96 may include magnetic sensor 98 that may be disposed within a magnetic field generated by magnetic lens 100. Apparatus 96 may also include control circuit 102 which may be coupled to magnetic sensor 98 and magnetic lens 100. The apparatus may be configured to continuously control the magnetic field strength of the magnetic lens. Alternatively, the apparatus may be configured to intermittently control the magnetic field strength of the magnetic lens. For example, the apparatus may be configured to alter and/or control the magnetic field strength of the magnetic lens approximately once per second. The magnetic lens may be configured and used as described herein. For example, magnetic lens 100 may be configured to apply a magnetic field to a charged particle beam, and the charged particle beam may be configured to travel through the magnetic lens. Magnetic lens 100 may also be configured to operate as a magnetic condenser lens or a magnetic objective lens. Therefore, the magnetic lens may be configured to reduce aberrations in a charged particle beam, such as chromatic aberration and stigmation. The apparatus, however, may also be coupled to any magnetic lens configured to generate a magnetic field when a current is applied to the magnetic lens.

Apparatus 96 may be coupled to a magnetic lens and to a system, which may utilize the magnetic lens during use, such as a scanning electron microscope, a tunneling electron microscope, a focused ion beam device, or any other system which may be configured to inspect or fabricate a specimen such as a semiconductor device using a charged particle beam. The semiconductor device may be fabricated, prior to inspection, using a semiconductor manufacturing process, such as lithography, etch, ion implantation, deposition, chemical-mechanical polishing or plating. Additionally, the semiconductor device may be a portion of a device that may be formed on a semiconductor substrate. Alternatively, the semiconductor device may be a working device which may be formed on a semiconductor substrate during semiconductor manufacturing. The magnetic lens, however, may also be coupled to any system which utilizes a charged particle beam during operation such as an e-beam lithography system.

The system may include at least one magnetic lens. The magnetic lens may be configured to apply a magnetic field to a charged particle beam. The system may also include a charged particle beam source configured to produce the charged particle beam. The system may be further configured such that the charged particle beam may be configured to travel through the magnetic lens prior to interacting with the specimen. In addition, the system may include a stage configured to support at least a portion of the specimen. The stage may also be positioned along the path of the charged particle beam such that the charged particle beam may interact with the specimen. The system may also include any of the devices as described and shown in FIG. 3 including, but not limited to, electrostatic or electromagnetic deflectors, beam-limiting apertures, Wien filters, magnetic condenser lenses, Schottky solid state barrier detectors, an operating system, and an imaging device.

Magnetic sensor 98 may be configured to generate an output signal responsive to a magnetic field strength of magnetic lens 100. Any signal that may be responsive to a magnetic field strength or another condition or property of the magnetic lens may be a mathematical representation of the magnetic field strength or another condition or property of the magnetic lens. For example, a signal may be linearly, proportionally, inversely, or logarithmically related to a condition or property of the magnetic lens. The magnetic sensor may be configured to operate as a Hall-effect sensor and may provide an output signal (e.g., a voltage). The output signal may be linearly and proportionally related to the magnetic field strength within the magnetic lens. The output signal of magnetic sensor 98 may be an analog signal or a digital signal. Examples of suitable Hall-effect sensors may be commercially available from Allegro Microsystems, Inc. of Worcester, Mass. Other suitable magnetic sensors, however, may also be used, which provide an output signal responsive to the magnetic field strength of the magnetic lens. The magnetic sensor may be disposed within a magnetic fringe field area of the magnetic lens, as shown in FIG.

5. Alternatively, the magnetic sensor may be disposed within a cavity of the magnetic lens. The cavity may be interposed between an inner pole piece of the magnetic lens and an outer pole piece of the magnetic lens. Additionally, the cavity may be disposed within the inner pole piece of the magnetic lens.

The apparatus may also include a temperature sensor to measure temperature variations of the magnetic lens. In an embodiment, apparatus 96 may include temperature sensor 104 coupled to the magnetic lens and the magnetic sensor. Temperature sensor 104 may be a matched temperature-dependent circuit element. Other suitable temperature sensors, however, may also be included in the apparatus. Temperature sensor 104 may be configured to monitor the temperature of the magnetic lens and to generate an output signal, or a temperature signal responsive to a temperature of the magnetic lens. Therefore, magnetic sensor 98 may be further configured to receive the temperature signal from temperature sensor 104. In this manner, temperature sensor 104 may be positioned proximal magnetic sensor 98 such that magnetic sensor 98 and temperature sensor 104 may be exposed to an approximately equal temperature of the magnetic lens 100. Furthermore, magnetic sensor 98 may be further configured to generate an output signal responsive to the magnetic field strength of the magnetic lens in addition to the temperature of the magnetic lens. As such, the output signal of magnetic sensor 98 may be altered to include variations in the temperature of the magnetic lens.

Control circuit 102 coupled to the magnetic sensor may be configured to receive the output signal from magnetic sensor 98. The control circuit may also include a low-pass filter element (not shown) configured to receive the output signal from the magnetic sensor. The low-pass filter element may also be configured to reduce fluctuations in the output signal from magnetic sensor 98. Therefore, the low-pass filter element may prevent fluctuations in the output signal from the magnetic sensor from being transferred into output signals generated by the control circuit. The control signal may be configured to generate an output signal in response to the output signal from the magnetic sensor. The signals generated by the control circuit may be used to control the magnetic lens. As such, the low-pass filter element may prevent fluctuations in the current supplied to the magnetic lens, which may adversely affect the performance of the magnetic lens.

Control circuit 102 may also be configured to receive input signal 106, which may be responsive to a predetermined magnetic field strength. An operating system (not shown) may be coupled to the apparatus and may be configured to generate input signal 106. The operating system may be manually-controlled or computer-controlled. Input signal 106 may include a voltage, which may have a linear and proportional relationship to the predetermined magnetic field strength of the magnetic lens. The predetermined magnetic field strength may be a variable magnetic field strength or a constant magnetic field strength. Therefore, the predetermined magnetic field strength may vary in response to a desired performance of the magnetic lens, which may also vary over time. In addition, the predetermined magnetic field strength may be constant in response to a desired performance of the magnetic lens, which may be sustained over a period of time. In this manner, the control circuit may be configured to alter the magnetic field strength of the magnetic lens or to maintain the magnetic field strength of the magnetic lens.

The predetermined magnetic field strength may be determined by an operator. For example, the manually-controlled operating system may be configured to provide information, which may describe the performance of the magnetic lens, to an operator. The operator may determine the desired performance or function of the magnetic lens by analyzing the information about the performance of the magnetic lens. The manually-controlled operating system may be further configured to receive an input signal from the operator representative of a desired performance or function of the magnetic lens. The input from the operator may also be representative of a predetermined magnetic field strength, which may enable the desired performance of the magnetic lens. The manually-controlled operating system may, therefore, be configured to then convert the input from the operator to an input signal, which may be received by the control circuit.

Alternatively, the predetermined magnetic field strength may be determined by a computer-controlled operating system. The computer-controlled operating system may include a computer such as a personal computer or a mainframe computer. For example, the computer-controlled operating system may be configured to receive information which may be descriptive of the performance of the magnetic lens. The computer-controlled operating system may be further configured to analyze the information and to generate an input signal representative of a desired performance or function of the magnetic lens. The input from the computer-controlled operating system may, therefore, be representative of the differences between the desired performance of the magnetic lens and the current performance of the magnetic lens. As such, the input signal from the computer-controlled operating system may also be representative of a predetermined magnetic field strength, which may enable the desired performance or the desired function of the magnetic lens.

Control circuit 96 may also be configured to generate a control signal responsive to the output signal from magnetic sensor 98 and input signal 106. In addition, control circuit 96 may be configured to generate a control signal responsive to the output signal and the input signal. The control circuit may also include operational amplifier 108 configured to receive the output signal from magnetic sensor 98 and input signal 106. The operational amplifier may be further configured to generate a comparison signal, which may be responsive to differences between the output signal from the magnetic sensor and the input signal from the operating system. For example, the operational amplifier may perform any number of comparisons between the output signal and the input signal including, but not limited to, subtraction, multiplication, division, and algorithms. Operational amplifier 108 may also be configured to generate a control signal, which may be a function of the comparison signal. For example, the operational amplifier may be configured to compare the output signal from the magnetic sensor and the input signal and to apply a gain to a difference between the two signals. Alternatively, the control circuit may include any circuit element or a plurality of circuit elements, which may be configured to perform the operations described herein.

Control circuit 96 may also be configured to drive magnetic lens 100 by applying a current to at least one coil of the magnetic lens. The current may be responsive to the control signal, which may be generated by the control circuit. The applied current may be effective to generate a magnetic field strength within the magnetic lens that is closer to the predetermined magnetic field strength than the measured magnetic field strength. Alternatively, the applied current may be effective to generate a magnetic field strength within the magnetic lens that is substantially equal to the predetermined magnetic field strength. Control circuit 96 may also include an electronic current drive system (not shown), which may be configured to receive the control signal from the control circuit and to drive the magnetic lens by applying a current to at least one coil of the magnetic lens. As such, the electronic current drive system may receive the control signal from operational amplifier 108, which may be included in control circuit 96. In addition, the electronic current drive system may be configured to perform an operation on the control signal. For example, the electronic current drive system may be configured to convert the control signal from an analog signal to a digital signal. The electronic current drive system may be further configured to alter and control a power source in response to the control signal. The power source may be configured to supply a current to at least one coil of the magnetic lens. Therefore, the current, which may be supplied to the magnetic lens, may be altered and/or controlled by the control circuit.

FIG. 6a illustrates an embodiment of a method for controlling a magnetic field strength of a magnetic lens. The method may be used to continuously or to intermittently control the magnetic field strength of a magnetic lens. Prior to performing the method, a magnetic field may be generated within magnetic lens 110 by applying a current to at least one coil winding such as primary coil winding 134 of the magnetic lens. The current may be a current applied to magnetic lens 110 prior to beginning the method such as a current appropriate for starting up a magnetic lens or a system in which the magnetic lens is used. The current may also be a current applied to magnetic lens 110 prior to beginning the method such as a current appropriate for a prior use of the magnetic lens. As shown in step 112, the method may include generating an output signal responsive to the magnetic field strength of magnetic lens 110. The output signal may be generated by using magnetic sensor 114. The output signal generated by the magnetic sensor may be a voltage, which may have a linear relationship to the magnetic field strength of the magnetic lens.

Figure 6B:
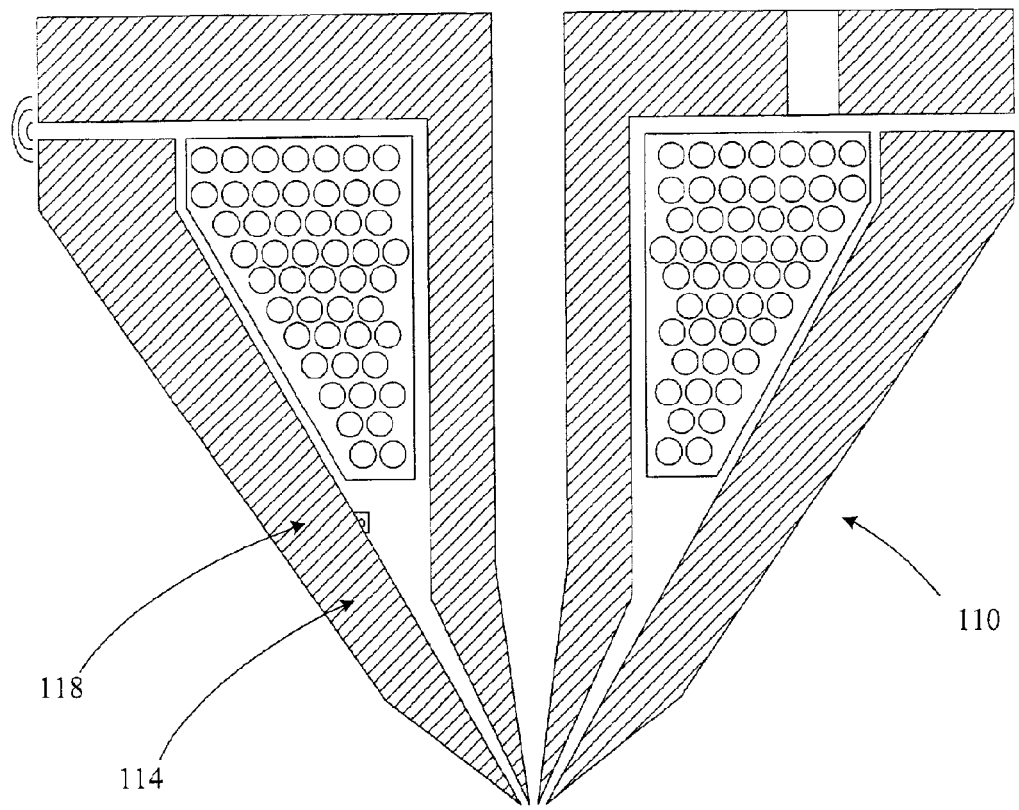
FIG. 6b depicts a schematic view of an embodiment of a magnetic lens in which a magnetic sensor is disposed within a cavity interposed between an outer pole piece of a magnetic lens and an inner pole piece of the magnetic lens.
Figure 6C:
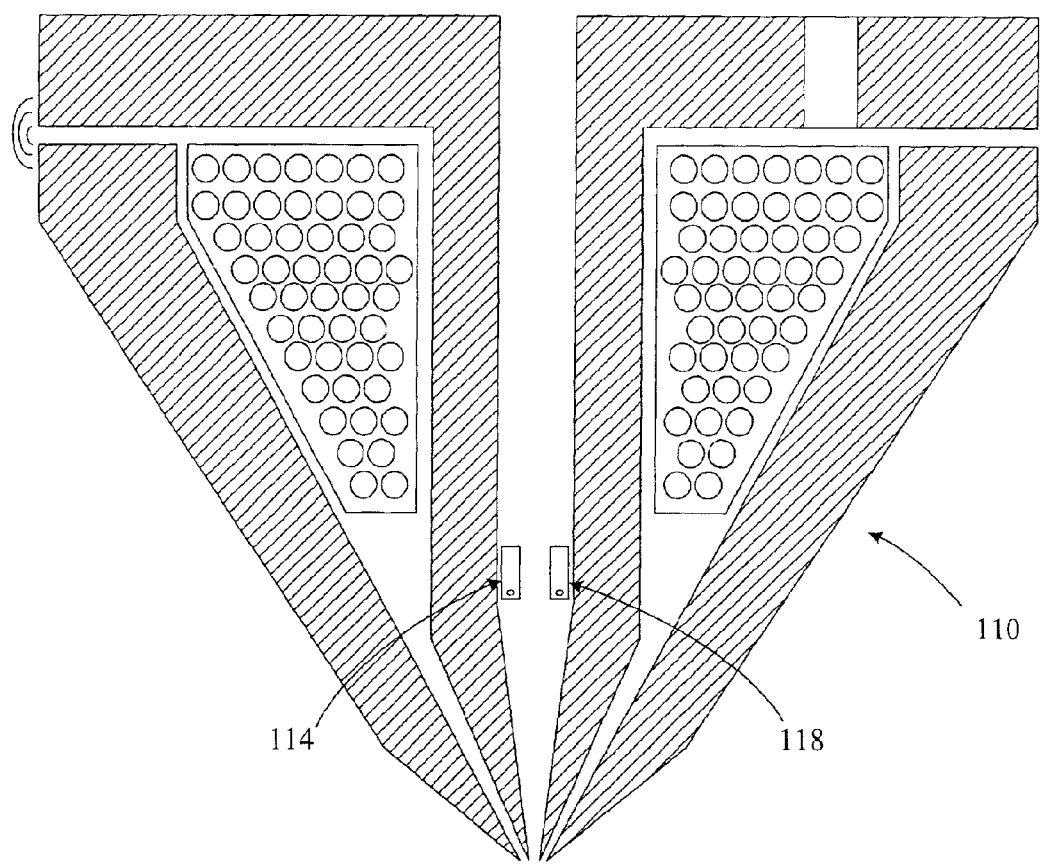
FIG. 6c depicts a schematic view of an embodiment of a magnetic lens in which a magnetic sensor is disposed within an inner pole piece of the magnetic lens.

Magnetic sensor 114 may be disposed within a magnetic field of magnetic lens 110. For example, magnetic sensor 114 may be disposed within a magnetic fringe field area of magnetic lens 110, as shown in FIG. 6a. Alternatively, magnetic sensor 114 may be disposed within a cavity of the magnetic lens. The cavity may be defined as a space between an outer pole piece of the magnetic lens and an inner pole piece of the magnetic lens. As shown in FIG. 6b, magnetic sensor 114 is disposed between an outer pole piece and an inner pole piece of magnetic lens 110. In addition, magnetic sensor 114 may be disposed within an inner pole piece of the magnetic lens. As shown in FIG. 6c, magnetic sensor 114 is disposed within an inner pole piece of magnetic lens 110. In this manner, magnetic sensors may be located at different positions internal and external to the magnetic lens.

In an embodiment, the method may include generating an output signal which may be responsive to a temperature of the magnetic lens, as shown in step 116. The temperature signal may be generating by using temperature sensor 118. The generated temperature signal may be responsive to a temperature of magnetic lens 110. The temperature sensor may be coupled to the magnetic lens and the magnetic sensor. Furthermore, the temperature sensor may send the generated temperature signal to the magnetic sensor. As a result, the magnetic sensor may alter the output signal of the magnetic sensor in response to the temperature signal. For example, the temperature signal may be used to alter the output signal of the magnetic sensor such that the magnetic sensor may be sensitive to fluctuations in the temperature of the magnetic lens. As such, temperature sensor 118 may be positioned proximal magnetic sensor 114. In this manner, the temperature signal generated by temperature sensor 118 may be responsive to a temperature of magnetic lens 110 proximal magnetic sensor 114 and temperature sensor 118. For example, as shown in FIG. 6a, temperature sensor 118 and magnetic sensor 114 may be placed within a magnetic fringe field area of magnetic lens 110. Alternatively, as shown in FIG. 6b, temperature sensor 118 and magnetic sensor 114 may be disposed within a cavity of the magnetic lens. In addition, as shown in FIG. 6c, temperature sensor 118 and magnetic sensor 114 may be disposed within an inner pole piece of magnetic lens 110.

In an additional embodiment, the method may include reducing fluctuations in the output signal, as shown in step 120. The output signal may be sent to a low-pass circuit element, which may be coupled to a control circuit. Reducing fluctuations in the output signal may provide improved control on the magnetic lens by eliminating erratic changes in the current being applied to at least one coil of the magnetic lens. In addition, the method may include sending the output signal to a control circuit, as shown in step 122. The control circuit may be coupled to the magnetic sensor and the magnetic lens.

In an embodiment, the method may include sending an input signal to the control circuit, as shown in step 124. The input signal may be responsive to a function of a predetermined magnetic field strength. For example, the predetermined magnetic field strength may be representative of a desired function or operating characteristic of the magnetic lens. Alternatively, the predetermined magnetic field strength may also be a substantially constant magnetic field strength. In this manner, the method may be used to eliminate variations in the magnetic field strength of the magnetic lens over time. The input signal may be a voltage, which may have a linear relationship to the predetermined magnetic field strength of the magnetic lens. The input signal may be generated by using an operating system, which may be coupled to the control circuit. The operating system may be manually-controlled or computer-controlled. As such, the input signal which may be determined by an operator or by a controller computer.

As shown in step 126, the method for controlling the magnetic field strength of a magnetic lens may include generating a control signal. The control signal may be responsive to a function of the output signal and the input signal. In an embodiment, an operational amplifier may be coupled to the control circuit. Therefore, generating the control signal may include generating a comparison signal by using the operational amplifier. The operational amplifier may be configured to generate the control signal by comparing the output signal from the magnetic sensor and the input signal. As such, the operational amplifier may generate a comparison signal, which may be responsive to differences between the output signal and the input signal. The operational amplifier may also be configured to perform a function on the generated comparison signal. For example, the operational amplifier may generate the control signal by applying a gain to the comparison signal.

In an embodiment, the method may also include sending the control signal to an electronic current drive system, as shown in step 128. The electronic current drive system may be coupled to the control circuit. The electronic current drive system may be used to control the current, which may be applied to at least one coil of the magnetic lens. In an embodiment, as shown in step 130, the method may include applying a current to at least one coil of the magnetic lens. The current may be responsive to the control signal which may be generated by the control circuit. Therefore, as shown in step 132, the predetermined magnetic field strength may be generated within the magnetic lens. For example, the current may be effective to generate a magnetic field strength within the magnetic lens that is closer to the predetermined magnetic field strength than a first or measured magnetic field strength. In addition, the current may also be effective to generate a magnetic field strength within the magnetic lens that is substantially equal to the predetermined magnetic field strength.

In an embodiment, the method for controlling a magnetic field strength of a magnetic lens may also include directing a charged particle beam through the magnetic lens. The charged particle beam may be an electron beam or an ion beam. In this manner, the magnetic lens may be used to apply a magnetic field to the charged particle beam. As such, the magnetic lens may be coupled to a device, which may use a magnetic lens to alter the path of a charged particle beam. Examples of such devices may include, but are not limited to, scanning electron microscopes, tunneling electron microscopes, e-beam lithography devices or focused ion beam devices. For example, the magnetic lens may be configured to operate as a magnetic lens incorporated into a scanning electron microscope.

Inspecting a specimen such as a semiconductor device, which may be formed on a semiconductor substrate, subsequent to intermediate and final processing steps has become an integral part of successfully producing working semiconductor devices. The semiconductor device may be fabricated prior to inspection by using a semiconductor manufacturing process. The semiconductor manufacturing process may include a number of processing steps as described herein. The semiconductor device may also include a semiconductor topography, which may be only a portion of a working semiconductor device. For example, a semiconductor device may be inspected subsequent to each of the many processing steps required to fabricate a working semiconductor device.

In an embodiment, the method for inspecting a specimen may include generating a magnetic field within the magnetic lens by applying a current to at least one coil of the magnetic lens. In addition, the method may also include applying the generated magnetic field to a charged particle beam by directing the charged particle beam through the magnetic lens. The charged particle beam may be an electron beam or an ion beam. The method may also include generating the charged particle beam by using a charged particle beam source. Prior to directing the charged particle beam through the magnetic lens, at least a portion of a specimen may be positioned on a stage configured to support the specimen. The stage may be located along a path of the charged particle beam. As such, the charged particle beam may impinge upon the specimen after passing through the magnetic lens. The charged particle beam exiting the magnetic lens may be substantially free of aberrations. Therefore, the magnetic lens may be coupled to a scanning electron microscope or other suitable device, which may apply a magnetic field to a charged particle beam to alter a path of the charged particle beam, or to reduce aberrations that may be present in the charged particle beam.

Inspecting a semiconductor device may also include monitoring and altering a magnetic field strength of the magnetic lens. Monitoring and altering the magnetic field strength of the magnetic lens may include generating an output signal, which may be responsive to a magnetic field strength of the magnetic lens by using a magnetic sensor. The magnetic sensor may be disposed within a magnetic field of the magnetic lens. The method may also include sending the output signal to a control circuit, which may be coupled to the magnetic sensor and the magnetic lens. In addition, the method may include sending an input signal to the control circuit. The input signal may be responsive to a function of a predetermined magnetic field strength. The method may also include using the control circuit to generate a control signal which may be responsive to a function of the output signal and the input signal. Furthermore, the method may include generating the predetermined magnetic field strength within the magnetic lens by applying a current to at least one coil of the magnetic lens. The current may be responsive to the control signal. The method may also include additional steps as described herein.

The apparatus and methods for using the apparatus described above may provide accurate control of the magnetic field within a current-driven magnetic lens. The magnetic lens may be coupled to any device which uses a charged particle beam to perform a function. Using the apparatus and methods to control a magnetic field of a magnetic lens may eliminate adverse effects of hysteresis on the performance of the magnetic lens. In addition, the apparatus and methods may also reduce the effects of temperature dependent material properties, drift in current drive electronics, low frequency noise, eddy currents, undesired superimposed fields on the magnetic field generated by a magnetic lens. Furthermore, the apparatus and methods described above may also be used to eliminate drift in the magnetic field strength over time from other causes. In the application to charged particle beam devices, this functionality may be useful for reproducibly tuning magnetic components as magnetic lenses, Wien filters, or deflection coils. Specifically, the magnetic field sensor may permit easier manual and automated operation of scanning electron microscopes and other electron beam devices. The magnetic feedback concept may greatly increase tool stability and tool to tool consistency. Specifically, optimized values of magnetic field for deflection coils, Wien filters and magnetic lenses may be readily reproduced. Additionally, using a magnetic field sensor may eliminate the need to couple a current sensing resistor to the control circuit. Therefore, the magnetic lens may be driven with the same current but by applying a lower voltage to the magnetic lens.

EXAMPLE

Effect of Magnetic Field Feedback Control on a Magnetic Lens

Figure 7:
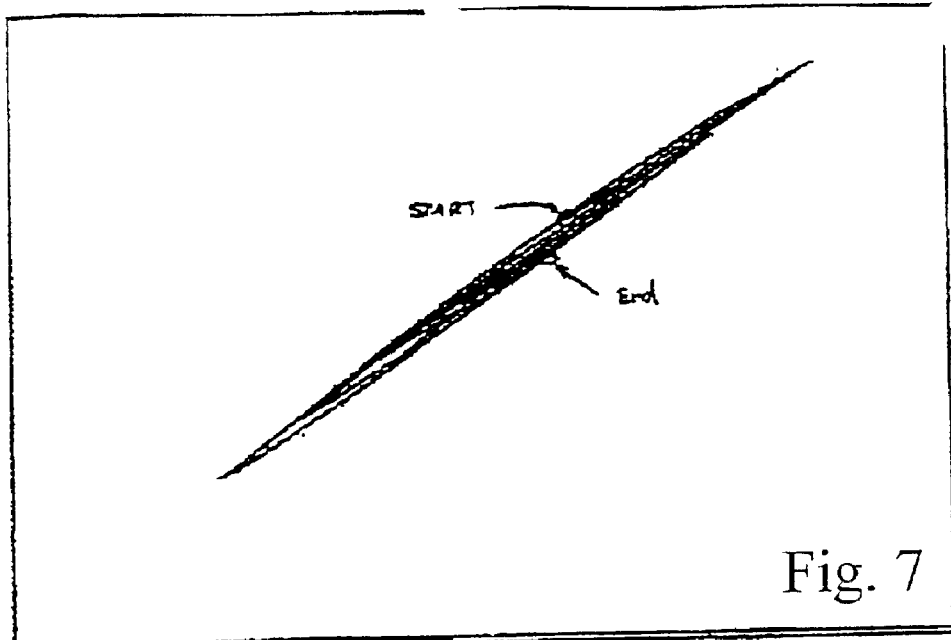
FIG. 7 depicts a plot of the hysteresis of a magnetic lens using a current feedback control apparatus.

FIG. 7 illustrates a plot of the hysteresis of a magnetic lens using a current feedback control apparatus. The magnetic field strength was estimated by measuring the current in the lens coil. The current in the lens coil was varied to alter the magnetic field strength of the magnetic lens. Variations in the current in the lens coil were highest at the beginning of testing and were decreased over time. The first current, which was applied to the lens coil, has been designated as the point on the graph which has been labeled "start." The last current, which was applied to the lens coil, has been designated as the point on the graph which has been labeled "end." The measured magnetic field has been plotted versus the desired magnetic field. The range of the measured magnetic field and the desired magnetic field range from approximately −10 gauss to approximately +10 gauss. As shown in FIG. 7, the measured magnetic field has a non-linear relationship to the desired magnetic field. The non-linear relationship may be caused by the fact that instantaneous magnetic field strength is determined by the present current and the history of all other currents in the coil and is commonly referred to as hysteresis.

Figure 8:
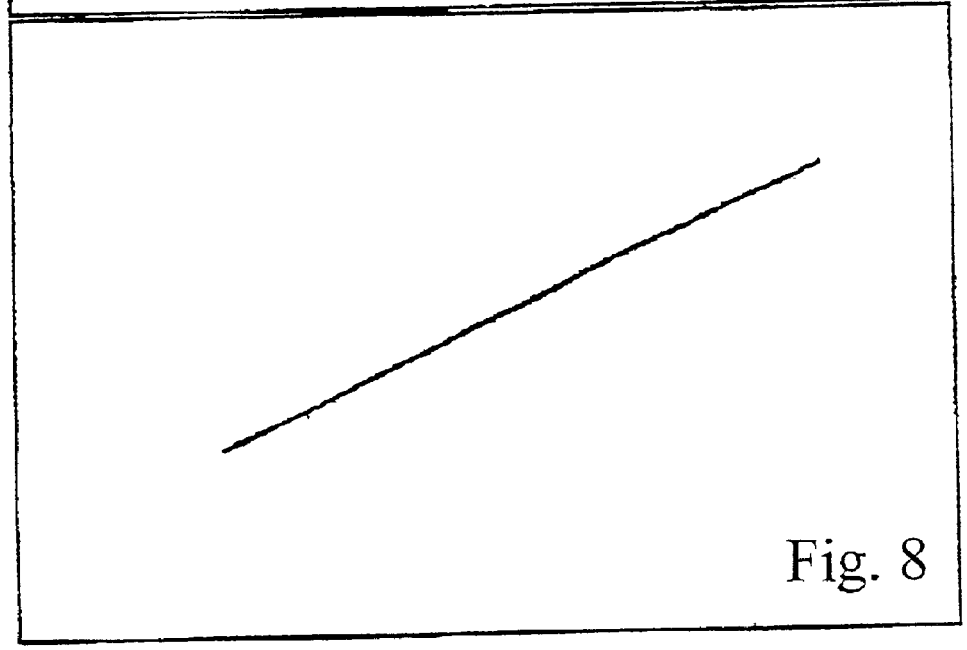
FIG. 8 depicts a plot of the hysteresis of a magnetic lens using a magnetic field feedback control apparatus.

FIG. 8 illustrates a plot of the hysteresis of a magnetic lens using a magnetic field feedback control apparatus. The magnetic field strength was estimated by measuring the magnetic field of the magnetic lens using an Allegro Hall Sensor (Allegro Microsystems, Inc., Worcester, Mass.). The current in the lens coil was varied to alter the magnetic field strength of the magnetic lens. Variations in the current in the lens coil were highest at the beginning of testing and were decreased over time. The measured magnetic field has been plotted versus the desired magnetic field. The range of the measured magnetic field and the desired magnetic field is from approximately −10 gauss to approximately +10 gauss. As shown in FIG. 8, by using a magnetic field feedback control apparatus, a linear relationship between the measured magnetic field and the desired magnetic field was established. The linear relationship between the measured magnetic field and the desired magnetic field indicates that the effects of hysteresis in the magnetic lens were effectively minimized. Therefore, by implementing a control method, which includes using a magnetic field feedback control apparatus as described herein, hysteresis in the magnetic field strength of the magnetic lens may be substantially eliminated.

It will be appreciated to those skilled in the art having the benefit of this disclosure that this invention is believed to provide a magnetic lens having at least one pole piece which has at least two sectors and an apparatus configured to control the magnetic field strength of a magnetic lens. Further modifications and alternative embodiments of various aspects of the invention will be apparent to those skilled in the art in view of this description. For example, the structure of a magnetic lens may also be applied to electrostatic devices, such as deflectors, or devices, which generate both magnetic and electrostatic potentials, such as Wien filters. In addition, the apparatus, which may monitor and control a magnetic lens using magnetic field feedback control, may be integrated into any device which generates a magnetic field during operation. It is intended that the following claims be interpreted to embrace all such modifications and changes and, accordingly, the specification and drawings are to be regarded in an illustrative rather than a restrictive sense.

What is claimed is:

1. An apparatus configured to control a magnetic field strength of a magnetic lens during use, comprising:
   a magnetic sensor disposed within a magnetic field generated by the magnetic lens, wherein the magnetic sensor is further disposed within the magnetic lens, wherein the magnetic sensor is configured to generate an output signal during use, wherein the output signal is responsive to a first magnetic field strength of the magnetic field generated by the magnetic lens, and wherein the magnetic field will be applied to a charged particle beam traveling through the magnetic lens; and
   a control circuit coupled to the magnetic sensor and the magnetic lens, where in the control circuit is configured:
      to receive the output signal from tho magnetic sensor during use;
      to receive an input signal responsive to a predetermined magnetic field strength during use;
      to generate a control signal responsive to the output signal and the input signal during use; and
      to apply a current to the magnetic lens, wherein the current is responsive to the control signal.

2. The apparatus of claim 1, wherein the magnetic lens is coupled to a scanning electron microscope.

3. The apparatus of claim 1, wherein the input signal comprises a voltage having a linear relationship to the predetermined magnetic field strength of the magnetic lens.

4. The apparatus of claim 1, wherein the output signal comprises a voltage having a linear relationship to the first magnetic field strength of the magnetic lens.

5. The apparatus of claim 1, wherein the control signal is further responsive to a function of the output signal and the input signal.

6. The apparatus of claim 1, wherein the control circuit is further configured to apply a current to at least one coil of the magnetic lens.

7. The apparatus of claim 1, wherein the current is effective to generate a second magnetic field strength within the magnetic lens, and wherein the second magnetic field strength is closer to he predetermined magnetic field strength than the first magnetic field strength.

8. The apparatus of claim 1, wherein the current is effective to generate a second magnetic field strength within the magnetic lens, and wherein the second magnetic field strength is substantially the same as the predetermined magnetic field strength.

9. The apparatus of claim 1, wherein the apparatus is further configured to continuously control the magnetic field strength of the magnetic lens during use.

10. The apparatus of claim 1, wherein the apparatus is further configured to intermittently control the magnetic field strength of the magnetic lens during use.

11. The apparatus of claim 1, wherein the magnetic sensor is further disposed within a cavity in the magnetic lens, and wherein the cavity is disposed between an outer pole piece of the magnetic lens and an inner pole piece of the magnetic lens.

12. The apparatus of claim 1, wherein the magnetic sensor is further disposed within an inner pole piece of the magnetic lens.

13. The apparatus of claim 1, further comprising a temperature sensor coupled to the magnetic lens, wherein the temperature sensor is configured to generate a temperature signal during use, and wherein the temperature signal is responsive to a temperature of the magnetic lens.

14. The apparatus of claim 13, wherein the temperature sensor is further coupled to the magnetic sensor, wherein the magnetic sensor is further configured to receive the temperature signal during use, and wherein the output signal is further responsive to the temperature of the magnetic lens.

15. The apparatus of claim 1, wherein the control circuit comprises a low-pass circuit element configured to receive the output signal during use and to reduce fluctuations in the output signal during use.

16. The apparatus of claim 1, wherein the control circuit comprises an operational amplifier configured to generate a comparison signal during use, wherein the comparison signal is responsive to a comparison of the output signal and the input signal, and wherein the control signal is further responsive to a function of the comparison signal.

17. The apparatus of claim 1, wherein the control circuit comprises an electronic current drive system configured to receive the control signal during use and to apply the current to the magnetic lens during use.

18. A method for controlling a magnetic field strength of a magnetic lens, comprising:
   generating an output signal in response to a first magnetic field strength of a magnetic field generated by the magnetic lens, wherein the magnetic field will be applied to a charged particle beam traveling through the magnetic lens, and wherein said generating is performed by a magnetic sensor disposed within the magnetic lens;

generating an input signal in response to a predetermined magnetic field strength;

generating an input signal in response to the output signal and the input signal; and applying a current to the magnetic lens, wherein the current is responsive to the control signal.

19. A system configured to inspect a specimen during use, comprising:

at least one magnetic lens configured to apply a magnetic field to a charged particle beam during use, wherein the magnetic lens is positioned along a path of the charged particle beam; and an apparatus configured to control a magnetic field strength of the magnetic field generated by the magnetic lens during use, wherein the apparatus is coupled to the magnetic lens and the system, the apparatus comprising:

a magnetic sensor disposed within the magnetic field generated by the magnetic lens, wherein the magnetic field will be applied to the charged particle beam traveling through the magnetic lens, wherein the magnetic sensor is further disposed within the magnetic lens, wherein the magnetic sensor is configured to generate an output signal during use, and wherein the output signal is responsive to a first magnetic field strength of the magnetic field generated by the magnetic lens; and a control circuit coupled to the magnetic sensor and the magnetic lens, wherein the control circuit is configured:

to receive the output signal from the magnetic sensor during use;

to receive an input signal responsive to a predetermined magnetic field strength during use;

to generate a control signal responsive to the output signal and the input signal during use; and to apply a current to the magnetic lens, wherein the current is responsive to the control signal.

20. A method for inspecting a specimen, comprising:

generating a magnetic field by a magnetic lens and applying the magnetic field to a charged particle beam, wherein applying the magnetic field to the charged particle beam comprises directing the charged particle beam through the magnetic lens; and controlling a magnetic field strength of the magnetic field of the magnetic lens, comprising:

generating an output signal in response to a first magnetic field strength of the magnetic field generated by the magnetic lens, wherein said generating is performed by a magnetic sensor disposed within the magnetic lens;

generating an input signal in response to a predetermined magnetic field strength;

generating a control signal in response to the output signal and the input signal; and applying a current to the magnetic lens, wherein the current is responsive to the control signal.

* * * * *

UNITED STATES PATENT AND TRADEMARK OFFICE
CERTIFICATE OF CORRECTION

PATENT NO. : 6,891,167 B2
DATED : May 10, 2005
INVENTOR(S) : Notte IV

It is certified that error appears in the above-identified patent and that said Letters Patent is hereby corrected as shown below:

<u>Column 31,</u>
Line 7, delete "an input" and substitute -- a control --.

Signed and Sealed this

Twenty-seventh Day of December, 2005

JON W. DUDAS
*Director of the United States Patent and Trademark Office*